United States Patent [19]

Sakamoto

[11] Patent Number: 5,581,093
[45] Date of Patent: Dec. 3, 1996

[54] CONTACT STRUCTURE OF AN INTERCONNECTION LAYER FOR A SEMICONDUCTOR DEVICE AND A MULTILAYER INTERCONNECTION SRAM

[75] Inventor: Osamu Sakamoto, Hyogo-ken, Japan

[73] Assignee: Mitsubishi Denki Kabushiki Kaisha, Tokyo, Japan

[21] Appl. No.: 554,508

[22] Filed: Nov. 7, 1995

Related U.S. Application Data

[62] Division of Ser. No. 293,771, Aug. 19, 1994, Pat. No. 5,475,240, which is a continuation of Ser. No. 845,980, Mar. 4, 1992, abandoned.

[30] Foreign Application Priority Data

Mar. 15, 1991 [JP] Japan ................................. 3-050954
Jan. 14, 1992 [JP] Japan ................................. 4-005222

[51] Int. Cl.⁶ .......................... H01L 27/11; H01L 29/786; H01L 29/417; H01L 29/43
[52] U.S. Cl. .............................. 257/67; 257/69; 257/382; 257/657; 257/754; 257/903
[58] Field of Search ............................. 257/51, 67–69, 257/369, 377, 382, 385, 752, 754, 755, 756, 903, 904, 655, 657

[56] References Cited

U.S. PATENT DOCUMENTS

| | | | |
|---|---|---|---|
| 4,785,341 | 11/1988 | Ning et al. | 257/555 |
| 4,786,954 | 11/1988 | Morie et al. | 257/303 |
| 4,829,018 | 5/1989 | Wahlstrom | 437/51 |
| 4,884,121 | 11/1989 | Ishii | 257/752 |
| 4,966,865 | 10/1990 | Welch et al. | 257/752 |
| 5,041,884 | 8/1991 | Kumamuto et al. | 257/401 |
| 5,061,983 | 10/1991 | Egawa et al. | 257/756 |
| 5,198,683 | 3/1993 | Sivan | 257/756 |

FOREIGN PATENT DOCUMENTS

| | | |
|---|---|---|
| 0163132 | 12/1985 | European Pat. Off. . |
| 0281711 | 9/1988 | European Pat. Off. . |
| 0380327 | 8/1990 | European Pat. Off. . |
| 0204171 | 12/1982 | Japan ................................. 257/67 |
| 0186051 | 9/1985 | Japan ................................. 257/67 |
| 0006855 | 1/1986 | Japan . |
| 0040133 | 9/1986 | Japan . |
| 0132317 | 6/1987 | Japan . |
| 0015620 | 1/1990 | Japan . |
| 0073666 | 3/1990 | Japan ................................. 257/903 |
| 0271663 | 11/1990 | Japan . |

OTHER PUBLICATIONS

"A Memory Cell With Polysilicon Thin Film Transistor (TFT) for a 4Mbit SRAM", Tsutsumi et al., Institute of Electronics and Communication Engineers of Japan Technical Report, vol. 90, No. 48, pp. 7–13.

"A New CMOS SRAM Cell With Fully Planarizing Technology", Martin et al., 1987 Symposium on VLSI Technology Digest of Technical Papers, pp. 103–104.

"Trench Self–Aligned EPROM Technology", Sekiya et al., 1986 Symposium on VLSI Technology Digest of Technical Papers, pp. 87–88.

"A High Performance SRAM Memory Cell With LDD–TFT Loads", Tsutsumi et al., 1991 Symposium on VLSI Technology Digest of Technical Papers, pp. 23–24.

*Primary Examiner*—Peter Toby Brown
*Attorney, Agent, or Firm*—Lowe, Price, LeBlanc & Becker

[57] ABSTRACT

A silicon layer in a lower layer and an interconnection layer arranged in an upper layer are electrically connected through an opening for contact. A silicon plug layer having the same conductivity type as that of the silicon layer is embedded in the opening. The silicon plug layer is embedded in the opening by an etch back method after deposited using a CVD method. The interconnection layer in the upper layer has conductivity type different from that of the silicon plug layer. A refractory metal silicide layer is formed between the upper interconnection layer and the silicon plug layer.

The refractory metal silicide layer prevents pn junction from being formed between the upper interconnection layer and the silicon plug layer.

2 Claims, 23 Drawing Sheets

5,581,093

1

CONTACT STRUCTURE OF AN INTERCONNECTION LAYER FOR A SEMICONDUCTOR DEVICE AND A MULTILAYER INTERCONNECTION SRAM

This application is a division of application Ser. No. 08/293,771, filed Aug. 19, 1994, now U.S. Pat. No. 5,475,240, which is a continuation of Ser. No. 07/845,980, filed Mar. 4, 1992, now abandoned.

BACKGROUND OF THE INVENTION

1. Field of the Invention

The present invention relates to improvement of a contact structure of an interconnection in a region having steps in a semiconductor device having a multilayer interconnection structure.

2. Description of the Background Art

In the field of a semiconductor device, increase of integration density and miniaturization of an element structure are required. In order to meet such requirements, a structure is conceived in which a plurality of elements are stacked three-dimensionally on a surface of a semiconductor substrate. Such a stacked type semiconductor device increases integration density of a main surface of the semiconductor substrate; however, it has been pointed out that several problems arise from the fact that an interconnection layer is arranged on a region having steps.

As one example of a semiconductor device having a structure in which semiconductor elements are stacked on a substrate, a structure of an SRAM (Static Random Access Memory) will be described. FIGS. 26 through 28 show a structure of a memory cell of a CMOS type SRAM using a thin film transistor as a load, which is shown in "A Memory Cell with Polysilicon Thin Film Transistor (TFT) for a 4Mbit SRAM", Tsutsumi et al., Institute of Electronics and Communication Engineers of Japan Technical Report, Vol. 90, No. 48, p7–p13. FIG. 29 is an equivalent circuit diagram of a memory cell of the SRAM. Referring to FIG. 29, a memory cell of a CMOS type SRAM has a pair of CMOS inverters. One CMOS inverter has an n channel MOS drive transistor 20a and a p channel MOS thin film load transistor 21a. The other CMOS inverter has an n channel MOS drive transistor 20b and a p channel MOS thin film load transistor 21b. The gates of transistors 20a, 21a of said one CMOS inverter are cross connected to a store node 25b common to transistors 20b, 21b of said the other CMOS inverter, and the gates of transistors 20b, 21b of said the other CMOS inverter are cross-connected to a stored node 25a common to transistors 20a, 21a of said one CMOS inverter to constitute a flip-flop circuit. The sources of p channel MOS thin film load transistors 21a, 21b are connected to a power supply 23. Each of the sources of n channel MOS drive transistors 20a, 20b is connected to ground. Store nodes 25a, 25b of the flip-flop circuit are connected respectively to n channel MOS transfer transistors 22a, 22b. The gates of n channel MOS transfer transistors 22a, 22b are connected to a word line 27. The drain regions of n channel MOS transfer transistors 22a, 22b are respectively connected to bit lines 26a, 26b.

An operation of writing information into a memory cell will be described. For example, if store node 25a is set at a ground potential, and store node 25b at a power supply potential then bit line 26a is set at a ground level, and bit line 26b at a power supply level. N channel MOS transfer transistors 22a, 22b are turned on by applying a prescribed potential to word line 27.

An operation of reading information from a memory cell will be described. Bit lines 26a, 26b are connected to a sense amplifier circuit. Under the condition, word line 27 is supplied with a prescribed potential to turn on n channel MOS transfer transistors 22a, 22b. As a result, potentials of store nodes 25a, 25b are read to bit lines 26a, 26b.

A specific structure of a memory cell of an SRAM will be described with reference to FIGS. 26 through 28. FIGS. 26 and 27 are plan structural views of a memory cell. For convenience, the memory cell is divided into a lower layer portion and an upper layer portions of a substrate to show a plan structure of the lower layer portion of the memory cell in FIG. 26 and a plan structure of the upper layer portion in FIG. 27. FIG. 28 is a sectional structural view taken along line X—X in FIGS. 26 and 27. Referring to FIGS. 26 through 28, the memory cell of an SRAM comprises n channel MOS drive transistors 20a, 20b and n channel MOS transfer transistors 22a, 22b, etc. in a lower region closer to a surface of a silicon substrate 1. P channel MOS thin film load transistors 21a, 21b are arranged in an upper region formed on a main surface of silicon substrate 1 with an interlevel insulating layer 9 interposed.

Referring mainly to FIG. 28, a p well region 2 is formed on a surface of silicon substrate 1. A field oxide film 4 and a $p^{30}$ isolation region 3 are formed in an isolation region on a main surface of p well region 2. An n channel MOS drive transistor 20a and an n channel MOS transfer transistor 22b each comprises $n^+$ source/drain regions 7, 7, a gate oxide film 5 and gate electrode 6. Gate electrode 6 has a polycide structure formed of a polycrystalline silicon layer 6a and a metal silicide film 6b which was formed on a polycrystalline silicon layer 6a.

The surface of silicon substrate 1 is covered with a thick interlevel insulating layer 9. The p channel thin film load transistor 21b is formed on a surface of interlevel insulating layer 9. A thin film transistor 14 comprises a gate electrode 8b formed on the surface of interlevel insulating layer 9, a gate oxide film 13 covering a surface of gate electrode 8b, $p^+$ source/drain regions 12a, 12c, and a channel region 12b. $P^+$ source/drain regions 12a, 12c and channel region 12b are formed in a thin polycrystalline silicon layer having a thickness of about 20 nm. Gate electrode 8b includes impurity of p type.

An interconnection structure of store node 25b in which n channel MOS drive transistor 20a is formed in a lower layer, n channel MOS transfer transistor 22b, and p channel MOS thin film load transistor 21b are formed in an upper layer will be described. An opening 16 is formed in interlevel insulating layer 9. Inside opening 16, gate electrode 6 of n channel MOS drive transistor 20a and one of $n^+$ source/drain regions 7 of n channel MOS transfer transistor 22b is exposed. An interconnection layer 8a of polycrystalline silicon is formed inside opening 16 and connected simultaneously to gate electrode 6 of n channel MOS drive transistor 20a and $n^+$ source/drain region 7 of n channel MOS transfer transistor 22b. Such a contact structure is termed shared contact. A portion of interconnection layer 8a extends to the surface of interlevel insulating layer 9. A polycrystalline silicon layer constituting a $p^+$ source/drain region 12a of p channel MOS thin film load transistor 21b is connected to a surface of the interconnection layer 8a. Interconnection layer 8a is formed of polycrystalline silicon, and p type impurity is included therein to provide conductivity. At the bottom portion of opening 16, a titanium silicide layer 11 is formed between interconnection layer 8a and source/drain region 7. Titanium silicide layer 11 prevents the formation of pn junction caused by direct connection of interconnection layer of p type 8a and source/drain region of n type 7. A structure this type is termed a direct contact structure in which interconnection layer 8a arranged on the surface of interlevel insulating layer 9 is connected to a lower layer, for example, an impurity region formed on the silicon substrate, through opening 16.

However, when a direct contact structure is formed to have large differences of level such as interconnection layer 8a used for the above mentioned memory cell of an SRAM, there is a problem that patterning of an interconnection layer is difficult. FIG. 30 is a sectional view showing a manufacturing step of forming interconnection layer 8a shown in FIG. 27. After opening 16 is formed in interlevel insulating layer 9, polycrystalline silicon layer 8 is deposited on the whole surface using, for example, a CVD method. A resist is applied onto a surface of the polycrystalline silicon layer 8. The resist is developed to have a prescribed pattern shape after exposure, using a photolithography method, to form a resist mask. A polycrystalline silicon layer 8 is etched using a resist mask, and interconnection layer 8a and gate electrode 8b of thin film transistor 14 are formed.

Polycrystalline silicon layer 8 is formed on the surface of interlevel insulating layer 9 having steps as shown. There are large steps of the polycrystalline silicon layer in the vicinity of opening 16. It is extremely difficult to form a very small resist mask on the surface of polycrystalline silicon layer 8 having such large steps, using an exposure technology. A recent exposure device particularly tends to reduce depth of focus. Therefore, a resolution of the resist mask deteriorates, which causes a problem that a pattern of interconnection layer 8a formed of the polycrystalline silicon layer becomes indistinct. Degradation of precision of an interconnection pattern hinders miniaturization of interconnection and impairs reliability of interconnection.

SUMMARY OF THE INVENTION

One object of the present invention is to provide an interconnection structure which enhances reliability of a multilayer interconnection structure including a contact portion having large steps.

Another object of the present invention is to provide an interconnection structure in which conductive regions of different conductivity types are connected to provide fine ohmic contact.

Another object of the present invention is to improve contact property of an interconnection arranged in a region having steps in a memory cell of an SRAM having a thin film transistor as a load.

Yet another object of the present invention is to improve patterning precision of an interconnection arranged in a region having steps in a memory cell of an SRAM having a thin film transistor as a load.

Still another object of the present invention is to provide a method of manufacturing an interconnection having an interconnection structure suitable for improving patterning precision of an interconnection arranged in a region having steps.

In one aspect of the present invention, a semiconductor device comprises a silicon layer and an interlevel insulating layer formed on a surface of the silicon layer and having a contact hole. A silicon plug layer is embedded within the contact hole. On the interlevel insulating layer, an interconnection layer of polycrystalline silicon is formed. An intermediate conductive layer is formed between the interconnection layer and the surface of the silicon layer for decreasing a breakdown voltage of a pn junction portion therebetween.

The silicon plug layer is embedded within the contact hole, so that the interconnection layer arranged on the surface of the interlevel insulating layer is formed on the flat surface of the silicon plug layer even in a region of the contact hole. Consequently, patterning precision of the interconnection layer is improved. In case that silicon plug layer and the interconnection layer have different conductivity types, the intermediate conductive layer of refractory metal or the like is interposed between the silicon plug layer and the interconnection layer so that, the formation of pn junction is prevented or the breakdown voltage of the pn junction portion is reduced. In case that the conductivity type of the silicon plug layer is different from that of a connecting portion of a silicon substrate, by interposing the intermediate conductive layer therebetween, the formation of pn junction is prevented or the breakdown voltage of the pn junction portion is reduced.

In another aspect of the present invention, an SRAM includes a memory cell having a pair of first and second CMOS inverters connected so as to constitute a flip-flop circuit and first and second MOS transfer transistors connected respectively to node points of the flip-flop circuit. The first CMOS inverter comprises a first MOS drive transistor of a first conductivity type formed on a main surface of a silicon substrate, and a first thin film transistor of a second conductivity type formed on a surface of an interlevel insulating layer formed on the main surface of the silicon substrate. The second CMOS inverter comprises a second MOS drive transistor of the first conductivity type formed on the main surface of the silicon substrate, and a second thin film transistor of the second conductivity type formed on the surface of the interlevel insulating layer. Furthermore, a first MOS transfer transistor and a second MOS transfer transistor are formed on the main surface of the silicon substrate. A gate electrode of the first MOS drive transistor, a source/drain region of the second MOS transfer transistor, and a source/drain region of the second thin film transistor are connected to each other through a first interconnection structure. A gate electrode of the second MOS drive transistor, a source/drain region of the first MOS transfer transistor, a source/drain region of the first thin film transistor are connected to each other through a second interconnection structure. The first interconnection structure comprises a silicon plug layer embedded within an opening formed in the interlevel insulating layer and connected to both gate electrode of the first MOS drive transistor and source/drain region of the second MOS transfer transistor, and an interconnection layer of polycrystalline silicon layer extending on the surface of the interlevel insulating layer. An intermediate conductive layer for reducing a breakdown voltage of a pn junction portion is formed between the interconnection layer and the silicon plug layer or between the silicon plug layer and the source/drain region of the second MOS transfer transistor. The second interconnection structure comprises a silicon plug layer embedded within an opening formed in the interlevel insulating layer and connected to both gate electrode of the second MOS drive transistor and source/drain region of the first MOS transfer transistor, and an interconnection layer of polycrystalline silicon extending on the surface of the interlevel insulating layer. An intermediate conductive layer for reducing a breakdown voltage of a pn junction portion is formed between the interconnection layer and the silicon plug layer, or between the silicon plug layer and the source/drain region of the first MOS transfer transistor.

In a further aspect of the present invention, a method of manufacturing a semiconductor device includes the following steps. First, an interlevel insulating layer is formed on a surface of a first silicon layer. An opening reaching the surface of the first silicon layer is formed in the interlevel insulating layer. A second silicon layer is formed on a surface of the interlevel insulating layer and in the opening. The second silicon layer is etched back to form a silicon plug layer of the second silicon layer formed within the opening. Impurity is then introduced into the silicon plug layer. A refractory metal layer is formed on surfaces of the interlevel insulating layer and the silicon plug layer, and heat treated to form a refractory metal silicide layer only on the surface of the silicon plug layer, and an unreacted portion of the refractory metal layer is removed. A polycrystalline silicon layer is formed on surfaces of the interlevel insulating layer and the refractory metal silicide layer and patterned to form an interconnection layer.

In yet another aspect of the present invention, a manufacturing method comprises the following steps. First, an interlevel insulating layer is formed on a surface of a first silicon layer. An opening reaching the surface of the first silicon layer is then formed in the interlevel insulating layer. A refractory metal silicide layer is formed only on the surface of the first silicon layer. A second silicon layer is then formed on a surface of the interlevel insulating layer and within the opening. The second silicon layer is etched back, and a silicon plug layer of the second silicon layer is formed within the opening. Impurities are introduced into the silicon plug layer. On the surfaces of the interlevel insulating layer and the silicon plug layer, a polycrystalline silicon layer is formed and patterned to form an interconnection layer.

In still another aspect of the present invention, a manufacturing method of a semiconductor device comprises the following steps. An interlevel insulating layer is formed on a surface of a first silicon layer. An opening reaching the surface of the first silicon layer is then formed in the interlevel insulating layer. A second silicon layer is formed on a surface of the interlevel insulating layer and within the opening. The second silicon layer is etched back, and a silicon plug layer of the second silicon layer is formed within the opening. Impurities are introduced into the silicon plug layer. On a surface of the silicon plug layer, an impurity layer of a high concentration including impurities in a concentration higher than that of impurities included in the silicon plug layer. On the surfaces of the interlevel insulating layer and the impurity layer of a high concentration, a polycrystalline silicon layer is formed and patterned to form an interconnection layer.

In the above manufacturing method, the silicon plug layer is formed using an etch back method within the contact hole, so that the surfaces of the silicon plug layer and the interlevel insulating layer can be readily planarized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
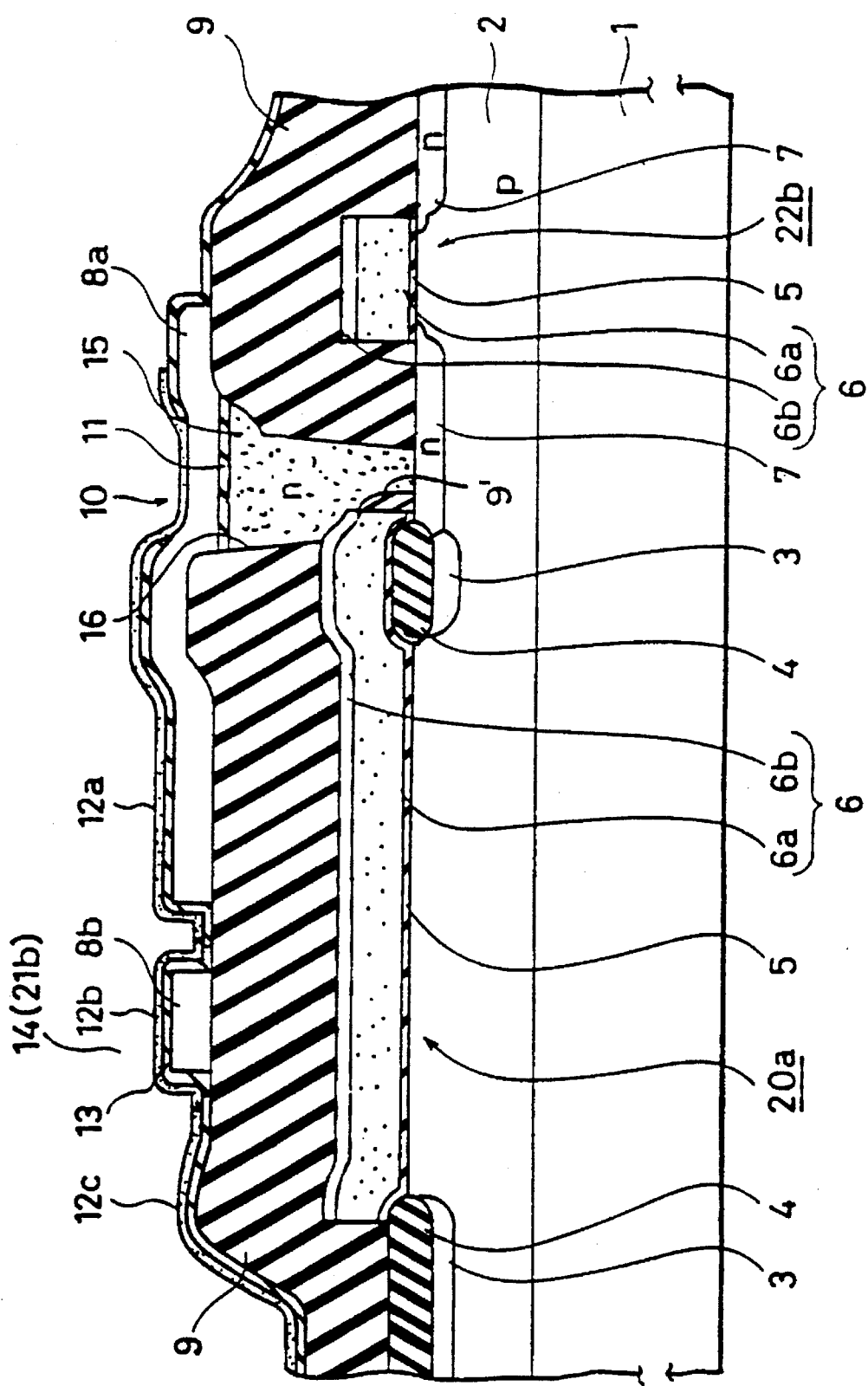
FIG. 1 is a sectional structural view of a memory cell of an SRAM in accordance with a first embodiment of the present invention.
Figure 28:
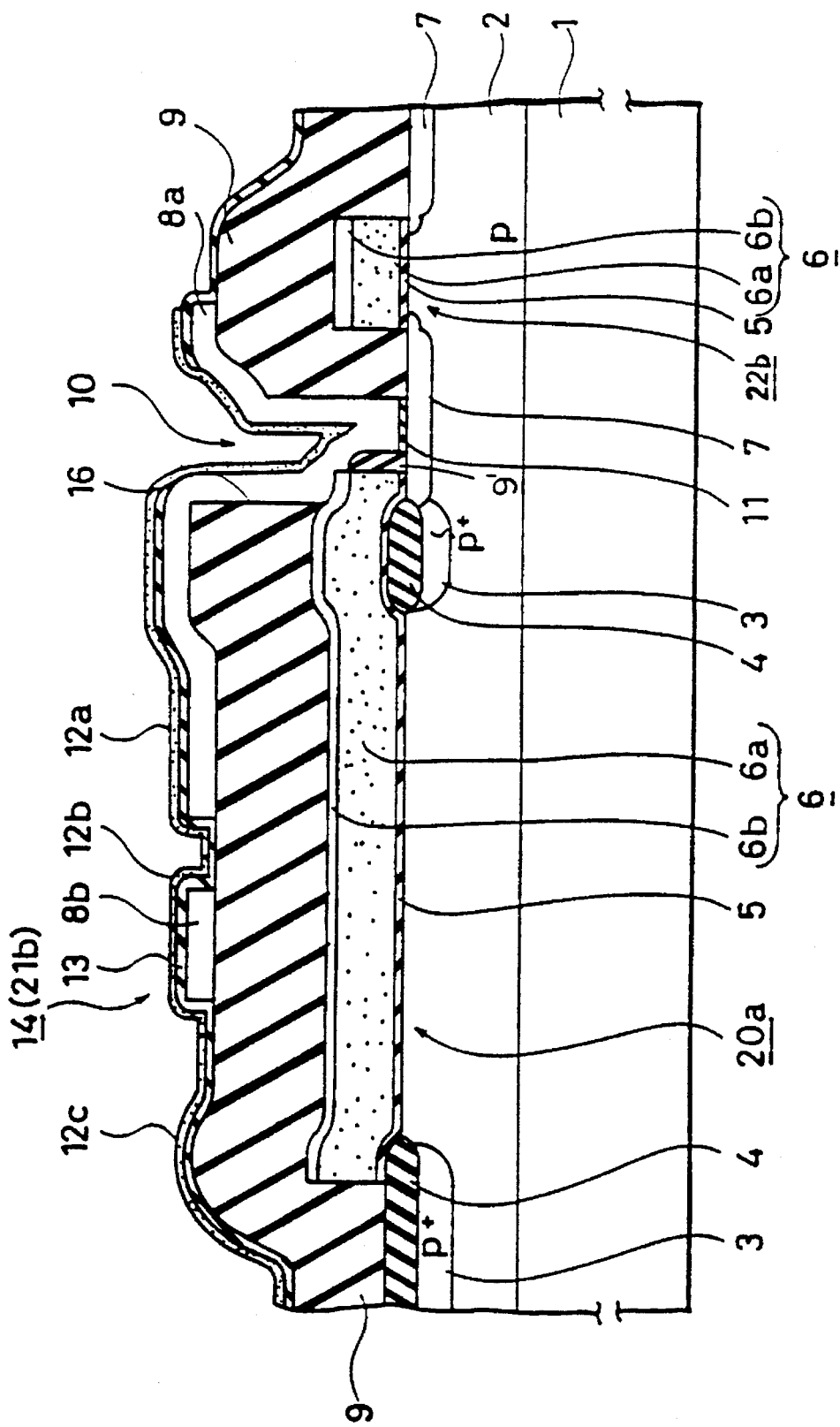
FIG. 28 is a sectional structural view of the memory cell taken along line X—X in FIGS. 26 and 27.
Figure 29:
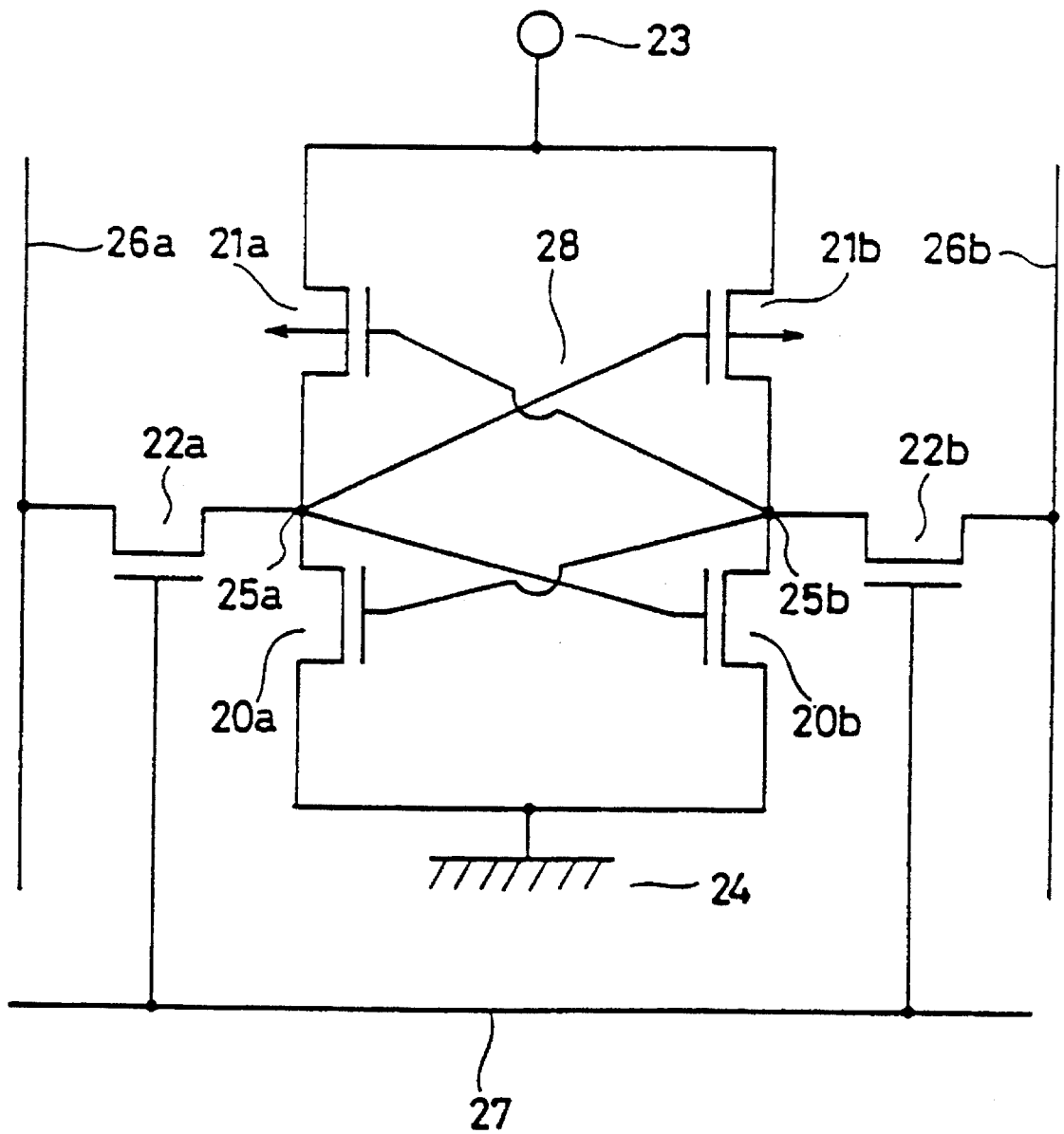
FIG. 29 is an equivalent circuit diagram of the memory cell of the conventional SRAM.
Figure 30:
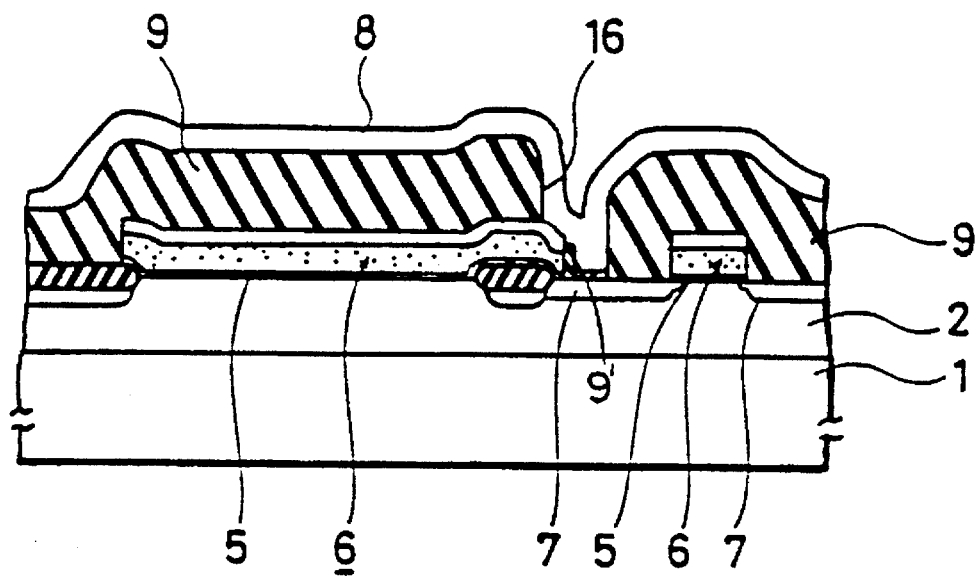
FIG. 30 is a sectional structural view showing one of the manufacturing steps of the memory cell shown in FIG. 28.

FIG. 1 shows a sectional structure taken at the same position as the position at which the sectional structure of FIG. 28 showing a conventional SRAM is taken. The sectional structure of the memory cell shown in FIG. 1 is the same as the sectional structure of a conventional memory cell shown in FIG. 28 except for a structure of direct contact. Hence, the direct contact structure will be mainly explained in the following, and as for structures of the other portions, the description of the background art should be referred to.

Direct contact portion 10 includes an n type polycrystalline silicon plug layer 15, a titanium silicide layer 11 and a p type polycrystalline silicon interconnection layer 8a. An opening 16 is formed in an interlevel insulating layer 9. An $n^+$ source/drain region 7 of an n channel MOS transfer transistor 22b and a gate electrode 6 of an n channel MOS drive transistor 20a are exposed at the bottom of opening 16. A plug layer 15 of polycrystalline silicon directly connected to the $n^+$ source/drain region 7 and gate electrode 6 is embedded within opening 16. N type impurity such as phosphorous (P), arsenic (As), etc. is introduced into polycrystalline silicon plug layer 15 in order to provide conductivity. A titanium silicide layer (intermediate conductive layer) 11 is formed on a surface of polycrystalline silicon plug layer 15. An interconnection layer 8a of polycrystalline silicon is formed on a surface of titanium silicide layer 11. P type impurity is introduced into interconnection layer 8a.

Thus, the direct contact structure of interconnection layer 8a with source/drain region 7 and gate electrode 6 improves flatness of interconnection layer 8a, because polycrystalline silicon plug layer 15 is embedded within the opening 16. Furthermore, ohmic contact of interconnection layer 8a, polycrystalline silicon plug layer 15, and source/drain region 7 can be obtained by having titanium silicide layer 11 interposed between interconnection layer 8a and polycrystalline silicon plug layer 15. That is because titanium silicide layer 11 prevents the formation of pn junction caused by direct connection of p type interconnection layer 8a and n type polycrystalline silicon plug layer 15. A thickness of titanium silicide layer 11 is preferably in the range of 13 to 200 nm. If the thickness of the titanium silicide layer is 13 nm or less, a problem such as a formation of pin holes within the film arises.

Steps of manufacturing the memory cell of the SRAM shown in FIG. 1 will be described.

Figure 2:
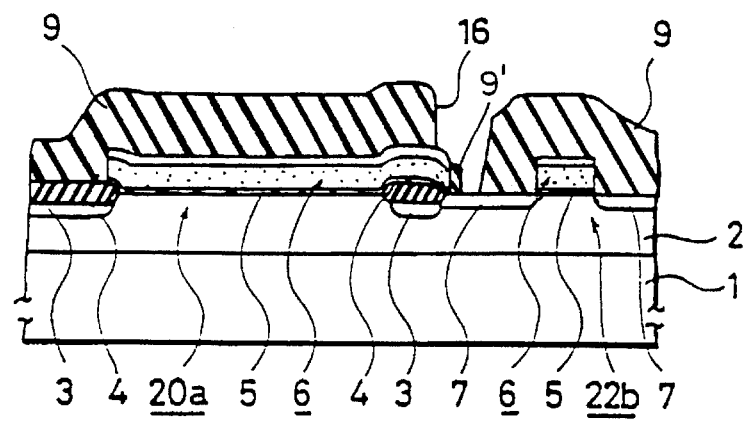
FIGS. 2 through 9 are sectional structural views showing manufacturing steps of the memory cell of the SRAM shown in FIG. 1.

Referring to FIG. 2, p type impurity is implanted in a main surface of a silicon substrate 1 using, for example, an ion implantation method. Subsequently, implanted p type impurity is diffused to the depth of about 2–3 μm from the main surface of substrate 1 by heat treatment to form a p well 2. A field oxide film 4 and p⁺ isolation layer 3 are formed on a prescribed region of a surface of p well 2 for isolation. Oxide films 5 of 12 nm–15 nm thickness are formed on the surface of p well 2 using, for example, a thermal oxidation method. Oxide films 5 form gate oxide films 5,5 of MOS transistors 20a, 22b. A polycide film formed of polycrystalline silicon 6a and refractory metal silicide 6b formed thereon is deposited on a surface of oxide film 5. The polycide film is patterned to a prescribed shape using a photolithography method and an etching method to form gate electrodes 6, 6 of MOS transistors 20a, 22b. N type impurity ion of a dose of $4 \times 10^{15}$ ions/cm² is implanted into p well 2 by an ion implantation method using the patterned gate electrodes 6 as masks. Subsequently, heat treatment is performed to activate impurity ions implanted into p well 2. Thus, n⁺ source/drain regions 7 of four MOS transistors 20a, 20b, 22a, 22b are formed. By following the above steps, n channel MOS drive transistors 20a, 20b and n channel MOS transfer transistors 22a, 22b are formed. Subsequently, a BPSG (BoroPhospho Silicate Glass) film is deposited on the whole surface of silicon substrate 1 using, for example, an atmospheric pressure CVD (Chemical Vapor Deposition) method. The BPSG is softened and reflowed by heat treatment, so that a surface of the BPSG film is planarized. In this step, an interlevel insulating layer 9 having a planarized surface is formed. An opening 16 for direct contact is formed in interlevel insulating layer 9 using a photolithography method and an etching method, formation of the opening 16 leaving a sidewall spacer 9' from the interlevel insulating layer 9. For the etching method to form opening 16, for example, a reactive ion etching method is used.

Figure 3:
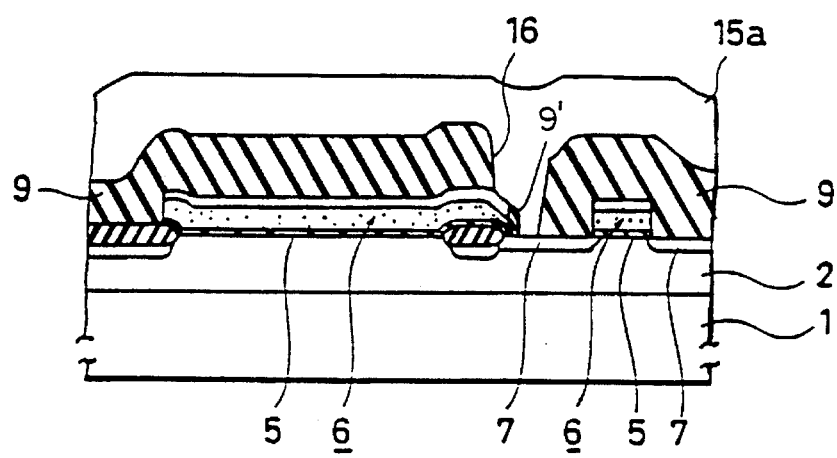

Referring to FIG. 3, a polycrystalline silicon layer 15a not doped with impurity is formed on a surface of interlevel insulating layer 9 using LPCVD (Low Pressure Chemical Vapor Deposition) method. Polycrystalline silicon layer 15a is deposited so thick as to fill opening 16 completely and make a surface of itself substantially flat in an upper portion of opening 16. A thickness more than a half of a maximum diameter of opening 16 is required as a standard of a thickness of polycrystalline silicon layer 15a to fill opening 16 completely.

Figure 4:
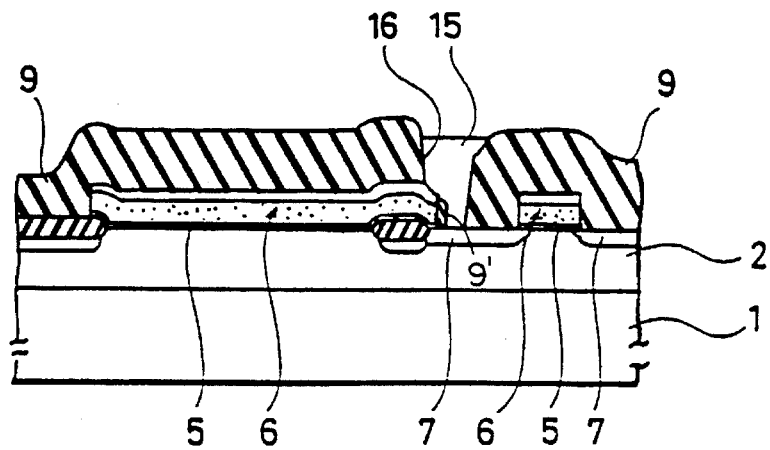

Referring to FIG. 4, a polycrystalline silicon layer 15a is etched, leaving a portion of the polycrystalline silicon layer only within opening 16 using an etch back method. Isotropic etching is used for the etching. In isotropic etching, polycrystalline silicon layer 15a is isotropically etched on the surface of interlevel insulating layer 9, but in the upper portion of opening 16, it is etched flat. As a result, only in opening 16, polycrystalline silicon layer 15a remains and a polycrystalline silicon layer 15 is formed.

Figure 5:
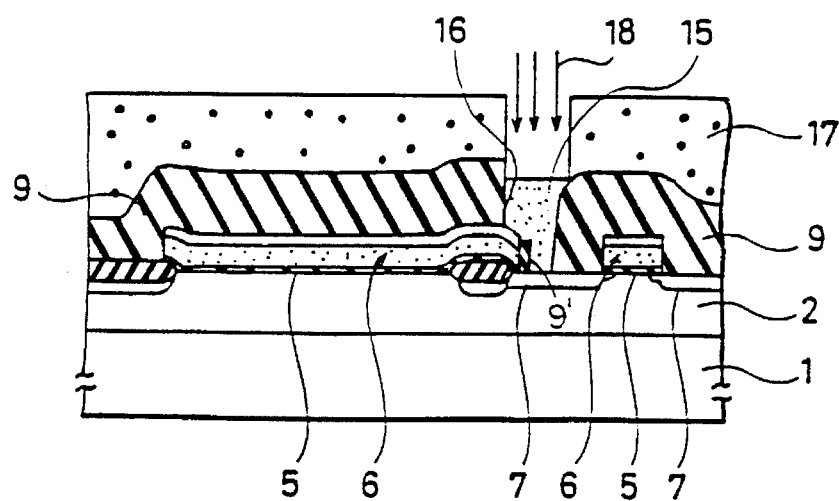

Referring to FIG. 5, a resist pattern 17 having an opening only above opening 16 is formed on a surface of interlevel insulating layer 9. Impurity ion is ion-implanted into polycrystalline silicon plug layer 15 using the resist pattern 17 as a mask in order to provide conductivity. In the embodiment, n type impurity, for example, phosphorous or arsenic of a dose of $1.5 \times 10^{16}$ ions/cm² is ion-implanted. Subsequently, impurity is activated by heat treatment.

Figure 6:
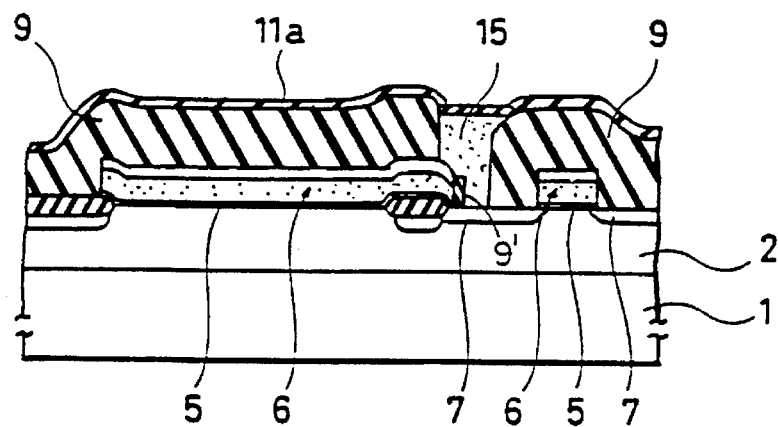

Referring to FIG. 6, a titanium layer 11a is deposited on the whole surface of silicon substrate 1 using a spattering method. Only a portion of the titanium layer located on a surface of polycrystalline silicon plug layer 15 is silicified using a RTA (Rapid Thermal Annealing) method.

Figure 7:
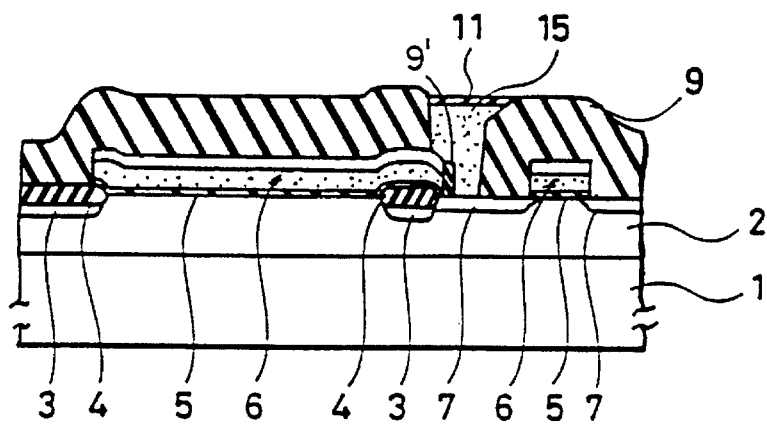

Referring to FIG. 7, an unreacted portion of titanium layer 11a formed on the surface of interlevel insulating layer 9 is removed, so that a titanium silicide layer 11 is formed on the surface of polycrystalline silicon plug layer 15.

Figure 8:
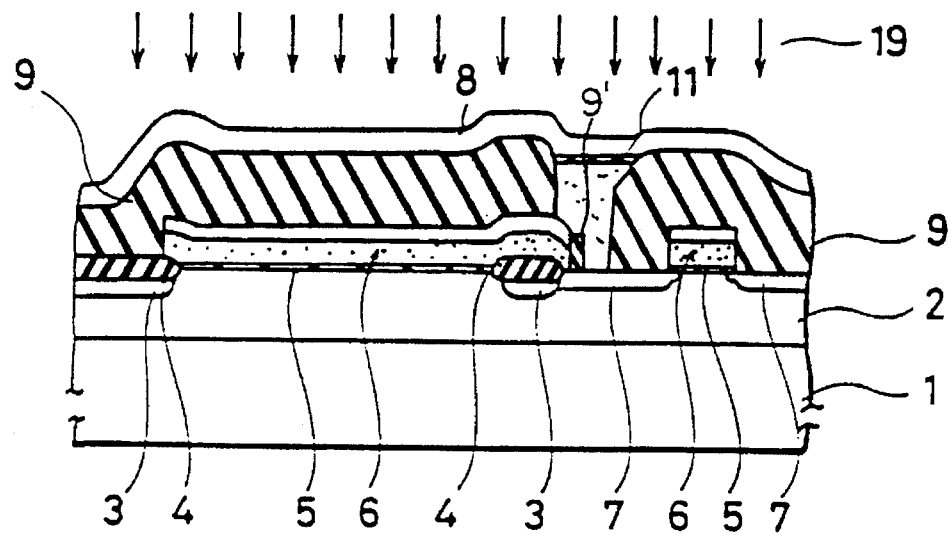

Referring to FIG. 8, a polycrystalline silicon layer 8, into which no impurity is introduced, is deposited on surfaces of interlevel insulating layer 9 and titanium silicide layer 11 in a thickness of about 100 nm, using the LPCVD method. P type impurity ion 19 is ion-implanted into polycrystalline silicon layer 8 in a dose of about $8 \times 10^{15}$ ions/cm². The p type impurity ion is activated by heat treatment.

Figure 9:
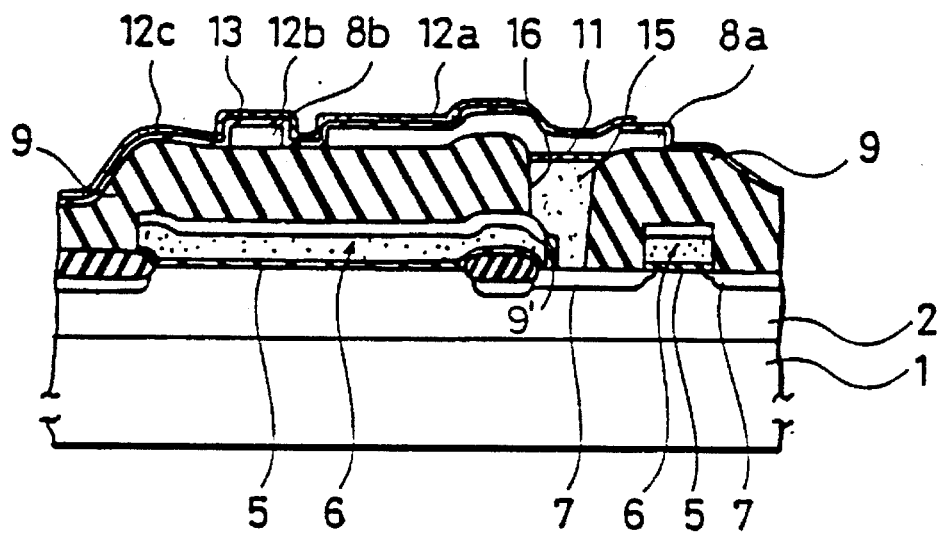

Referring to FIG. 9, polycrystalline silicon layer 8 of p type is patterned using a photolithography method and an etching method. A gate electrode 8b of p channel MOS thin film transistor 21b and interconnection layer 8a are formed in the step. A gate oxide film 13 of a thickness of about 20 nm is deposited on the whole surface of interlevel insulating layer 9 using, for example, the LPCVD method. One portion of gate oxide film 13 located above opening 16 is opened. A thin polycrystalline silicon layer is formed in a thickness of about 10 nm on the whole surface of gate oxide film 13 using, for example, the LPCVD method, and p⁺ source/drain regions 12a, 12c and a channel region 12b of a p channel MOS thin film load transistor 21b are patterned using a photolithography method and an etching method. A resist is formed on regions of the polycrystalline silicon layer which are to be channel regions of p channel MOS thin film load transistors 21a, 21b. P type impurity ion is ion-implanted into the polycrystalline silicon layer in a dose of about $1 \times 10^{15}$ ions/cm² using the resist as a mask, so that p⁺ source/drain regions 12a, 12c of p channel MOS thin film load transistors 21a, 21b are formed.

The memory cell shown in FIG. 1 is completed by following the above described steps.

A first variation of the first embodiment will be described. In the first embodiment, polycrystalline silicon layer 15a is formed using the LPCVD method in the step shown in FIG. 3. In place of the step, a silicon layer can be selectively grown on a surface of source/drain region 7 at a temperature ranging from 900° to 1000° C. using the CVD method. A single-crystalline silicon layer can be formed only within opening 16 by using the selective growth method. Impurity ion to provide conductivity is ion-implanted into the single-crystalline silicon plug layer 15.

As a second variation, a method of depositing so called doped polysilicon can be used instead of depositing non-doped polycrystalline silicon layer 15a. That is, phosphorus can be introduced into polycrystalline silicon by pouring $PH_3$ gas at the same time as the formation of a polycrystalline silicon layer by the LPCVD method. In this case, the step of ion-implanting for providing conductivity can be omitted.

Figure 10:
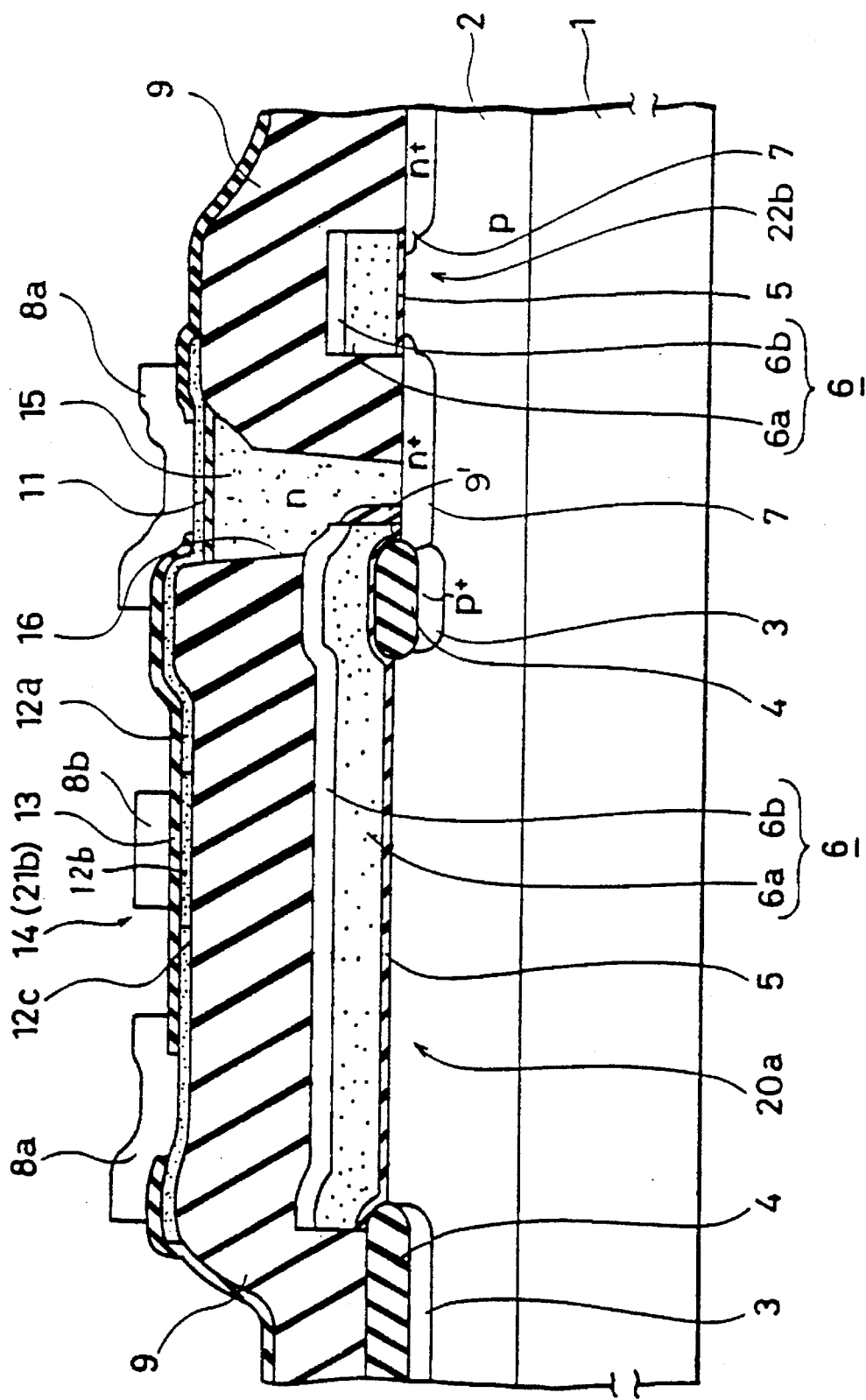
FIG. 10 is a sectional structural view of a memory cell of an SRAM in accordance with a second embodiment of the present invention.

The second embodiment of the present invention will be described. FIG. 10 is a sectional structural view of the memory cell according to the second embodiment. The memory cell according to the second embodiment is different from the memory cell of the first embodiment in a transistor structure of p channel MOS thin film load transistors 21a, 21b and a structure of interconnection layer 8a. A thin film transistor 14 (21b) has $p^+$ source/drain regions 12a, 12c and a channel region 12b in a thin polycrystalline silicon layer formed on a surface of interlevel insulating layers 9. Gate electrode 8b is formed on a surface of a gate insulating layer 13 formed on a surface of source/drain regions 12a, 12c and channel region 12b. The polycrystalline silicon layer of p type in which source/drain region 12a is formed extends on a surface of titanium silicide layer 11. Interconnection layer 8a formed of polycrystalline silicon, into which p type impurity is introduced, is connected to source/drain region 12a through an opening formed in gate insulating layer 13.

Figure 11:
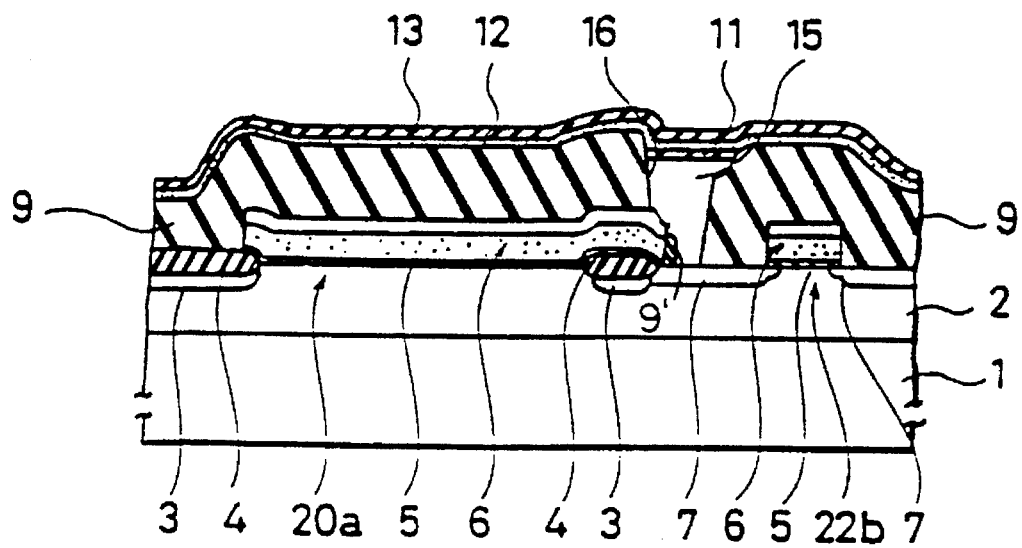
FIGS. 11 and 12 are sectional structural views showing major manufacturing steps of the memory cell of the SRAM shown in FIG. 10.
Figure 12:
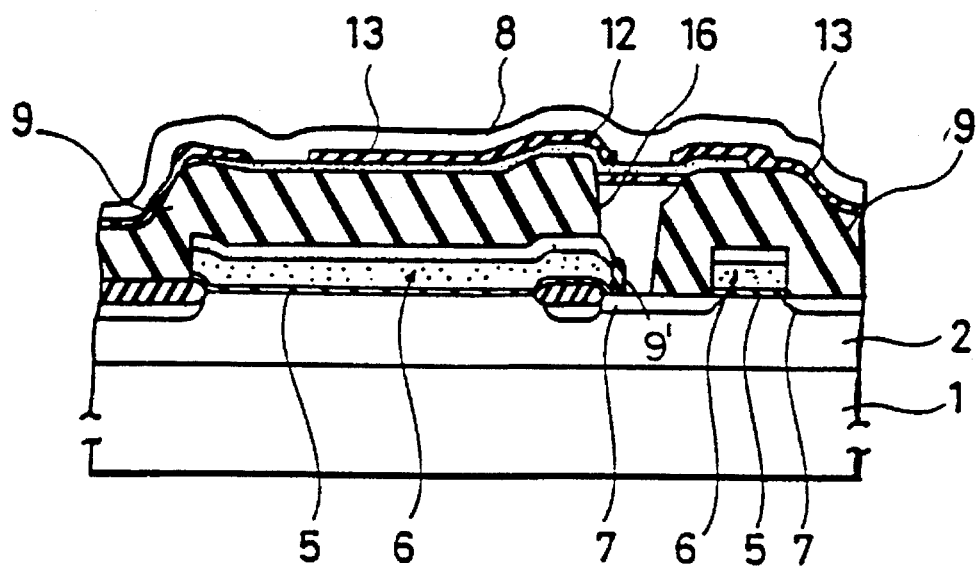

A manufacturing step unique to the memory cell according to the second embodiment will be described. FIGS. 11 and 12 are sectional views of manufacturing steps showing major manufacturing steps of the memory cell shown in FIG. 10. Since steps prior to the steps shown in FIG. 11 are the same as the steps of FIGS. 2 through 7 showing the first embodiment, the description of the steps is not repeated. Following the step shown in FIG. 7, referring to FIG. 11, a polycrystalline silicon layer 12 is deposited in a thickness of about 10 nm on surfaces of interlevel insulating layer 9 and titanium silicide layer 11 using, for example, the LPCVD method. Gate oxide film 13 is formed in a thickness of about 20 nm on a surface of polycrystalline silicon layer 12.

Referring to FIG. 12, openings are formed at prescribed positions of gate oxide film 13. These openings are formed respectively above opening 16 formed in interlevel insulating layer 9 and adjacently to p channel MOS thin film load transistors 21a, 21b. P type impurity ion is ion-implanted into polycrystalline silicon layer 12 with a resist mask for the formation of the openings in gate oxide film 13 remaining. In the ion implantation step, the resist mask prevents impurity ion from being introduced through thin gate oxide film 13 to a region of polycrystalline silicon layer 12 which does not need ion implantation. Subsequently, the resist mask is removed. A polycrystalline silicon layer 8 is formed in a thickness of about 100 nm on the whole surface of gate oxide film 13 using, for example, the LPCVD method. P type impurity ion is ion-implanted into polycrystalline silicon layer 8 in a dose of about $8 \times 10^{15}$ ions/cm$^2$ using an ion implantation method, followed by heat treatment. Thus, polycrystalline silicon layer 8 is provided with p type conductivity.

Polycrystalline silicon layer 8 is patterned using the photolithography method and the reactive ion etching method. Interconnection 8a and gate electrode 8b are formed in the patterning step. A resist pattern having larger width than that of gate electrode 8b is formed above gate electrode 8b. P type impurity ion is implanted into polycrystalline silicon layer 12 in a dose of $1 \times 10^{15}$ ions/cm$^2$ using the resist pattern as a mask, so that source/drain regions 12a, 12c are formed. Subsequently, the resist pattern is removed.

The memory cell shown in FIG. 10 is completed in accordance with the above stated steps.

Figure 13:
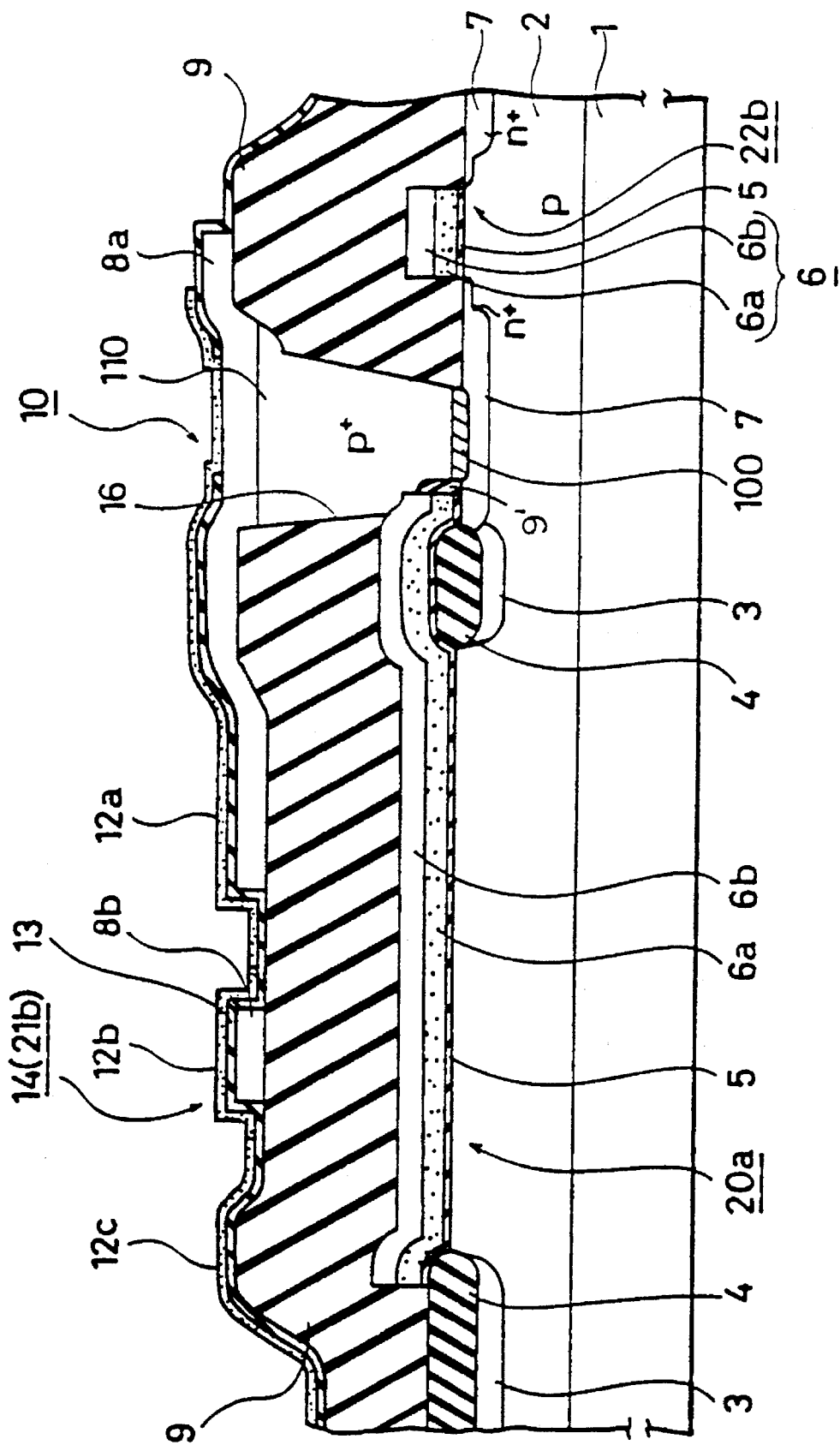
FIG. 13 is a sectional structural view of a memory cell of an SRAM according to a third embodiment of the present invention.

Thus, in the first and the second embodiment, an upper interconnection layer has p type conductivity and a lower impurity region has n type conductivity. In such a case, silicon plug layer 15 has n type conductivity, and therefore silicon plug layer 15 and the n type impurity region have fine ohmic contact. Fine ohmic contact can be also provided between the silicon plug layer and the upper interconnection layer of p type conductivity by interposing a refractory metal silicide layer etc. Conductivity types of the interconnection layer, the silicon plug layer and the impurity region may be opposite to those in the above embodiments. That is, the upper interconnection layer may have n type conductivity and the lower impurity region may have p type conductivity. In this case, silicon plug layer 15 should be provided with p type conductivity by introducing p type impurity. Referring again to the ion implantation step shown in FIG. 5. When p type impurity is introduced into silicon plug layer 15, it is desired to employ a high energy ion implantation method in which more than 150 keV ion implantation energy can be applied. If p type impurity ion is introduced into the central portion of silicon plug layer 15, then it is easy to diffuse impurity to whole silicon plug layer 15 by carrying out a lamp anneal process. Thus, resistance of the whole silicon plug layer 15 can be reduced. A third embodiment of the present invention will be described. FIG. 13 is a sectional structural view of a memory cell of an SRAM according to the third embodiment of the present invention. In the memory cell according to the third embodiment, a $p^+$ silicon plug layer 110 is embedded within contact hole 16, and interconnection layer 8a having the same type conductivity, that is, interconnection layer 8a of $p^+$ type conductivity is connected to the flat upper surface of p silicon plug layer 110. Intermediate conductive layer 100 of, for example, refractory metal silicide is formed between $n^+$ source/drain region 7 and $p^+$ silicon plug layer 110.

Manufacturing steps of the memory cell shown in FIG. 13 will be described. FIGS. 14 through 19 are sectional structural view successively showing respective manufacturing steps which are unique to the memory cell according to the third embodiment. The step shown in FIG. 14 corresponds to the step of the first embodiment shown in FIG. 2.

Figure 14:
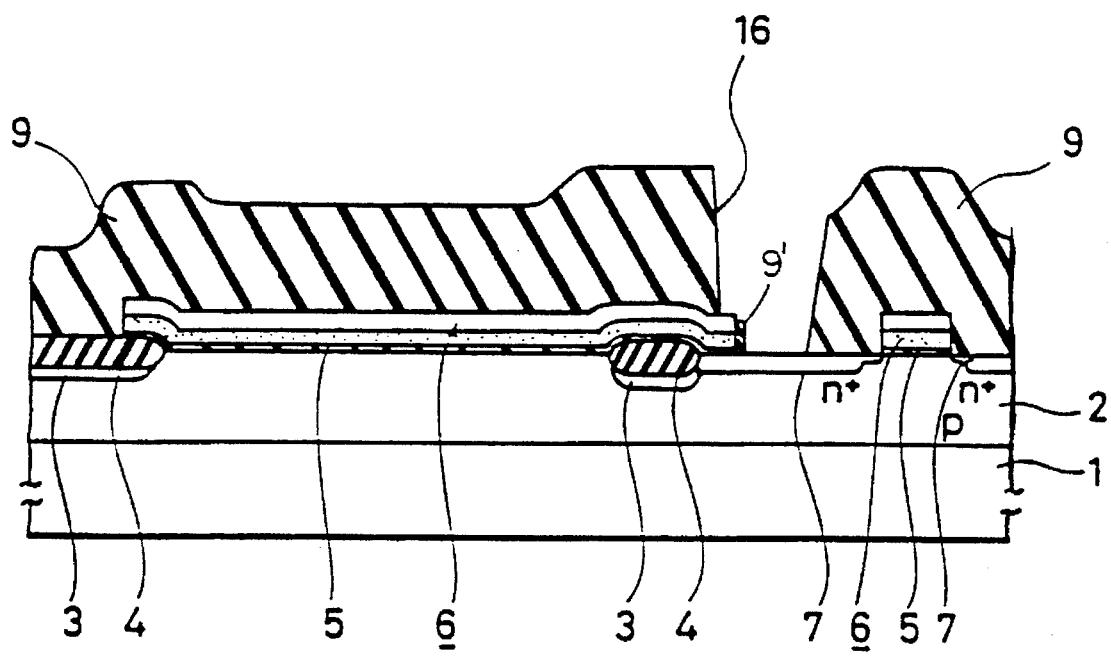
FIGS. 14 through 19 are sectional structural views showing main manufacturing steps of the memory cell shown in FIG. 13.
Figure 15:
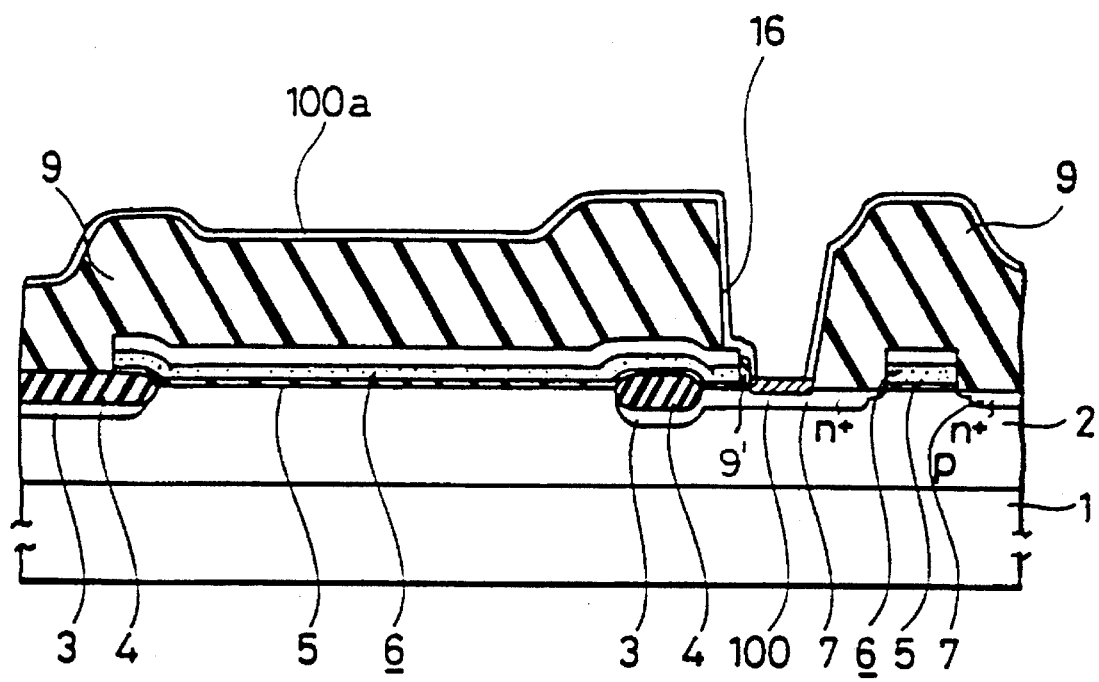

Referring to FIG. 15, after the step shown in FIG. 14, a titanium layer 100a is deposited in a thickness of about 50 nm on the whole surface of silicon substrate 1 using a spattering method. Thereafter, only the titanium layer connecting to a surface of $n^+$ source/drain region 7 is silicified to form titanium silicide layer 100 using an RTA method.

Figure 16:
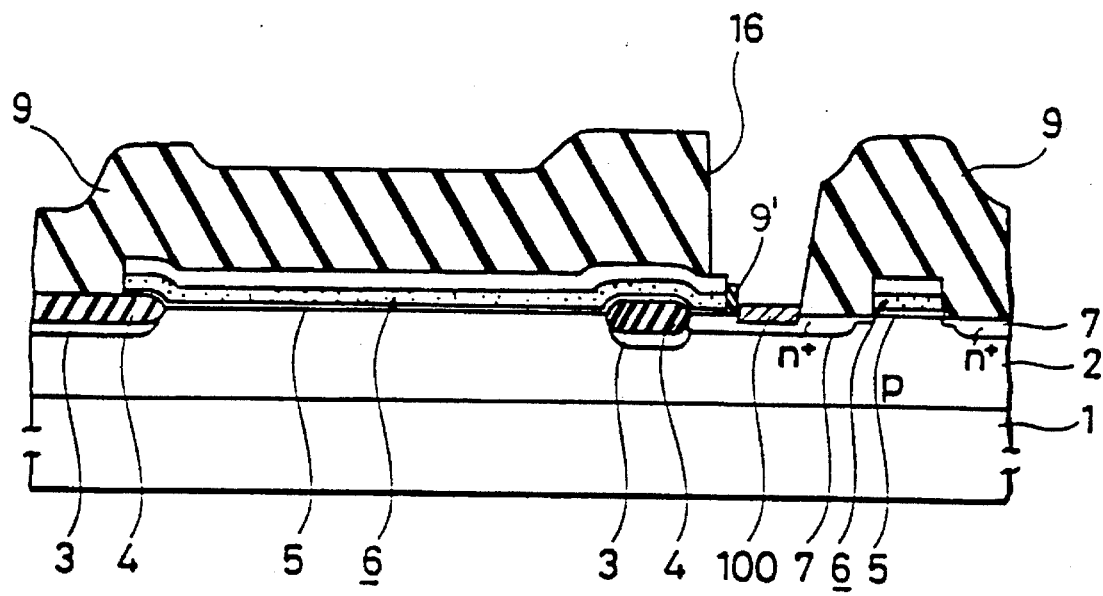

Referring to FIG. 16, an unreacted titanium layer 100a on a surface of interlevel insulating layer 9 and a sidewall of opening 16 is removed, so that titanium silicide layer 100 is formed only on the surface of $n^+$ source/drain region 7. A thickness of titanium silicide layer 100 is about 70 nm.

Figure 17:
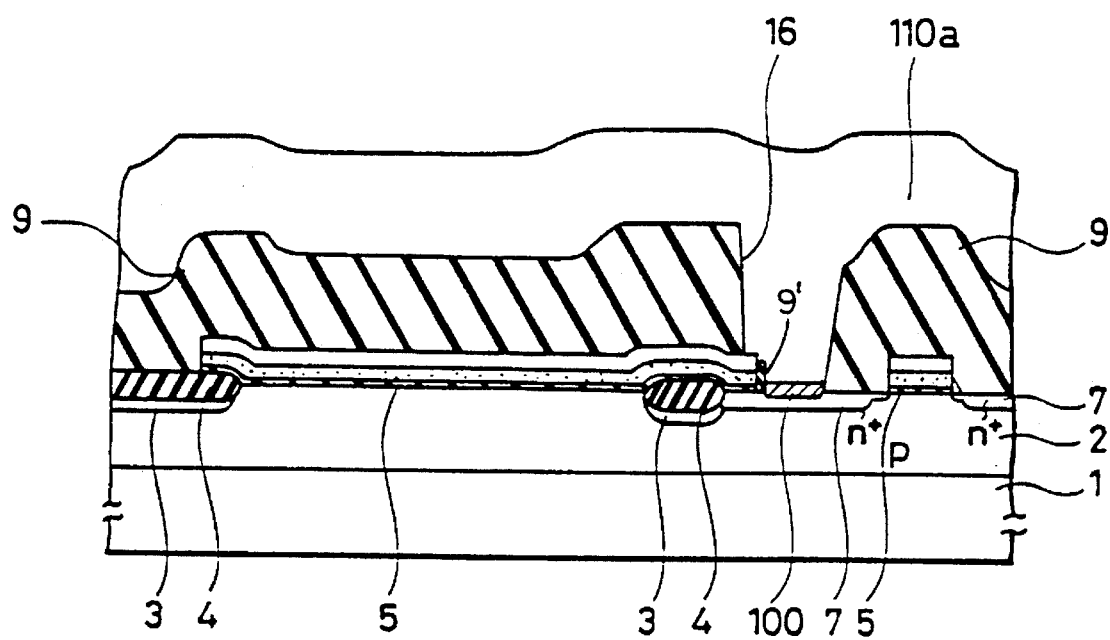

Referring to FIG. 17, a non-doped polycrystalline silicon layer 110a is formed on the surface of interlevel insulating layer 9 and within opening 16 using, for example, an LPCVD method. Opening 16 is completely filled with non-doped polycrystalline silicon layer 110a. Non-doped polycrystalline silicon layer 110a is formed so thick as to make its surface in the upper portion of opening 16 almost flat. If, for example, a diameter of opening 16 is about 600 nm, a thickness is 300 nm or more which is more than a half of the diameter. As a result, opening 16 is completely filled with polycrystalline silicon layer 110a. However, it is not enough to form a completely flat surface of the polycrystalline silicon layer in the upper portion of opening 16. Therefore, preferably, if the diameter of opening 16 is about 600 nm, polycrystalline silicon layer 110a is formed in a thickness of about 600 nm. The surface of polycrystalline silicon layer 110a is then formed flat in the upper portion of opening 16.

Figure 18:
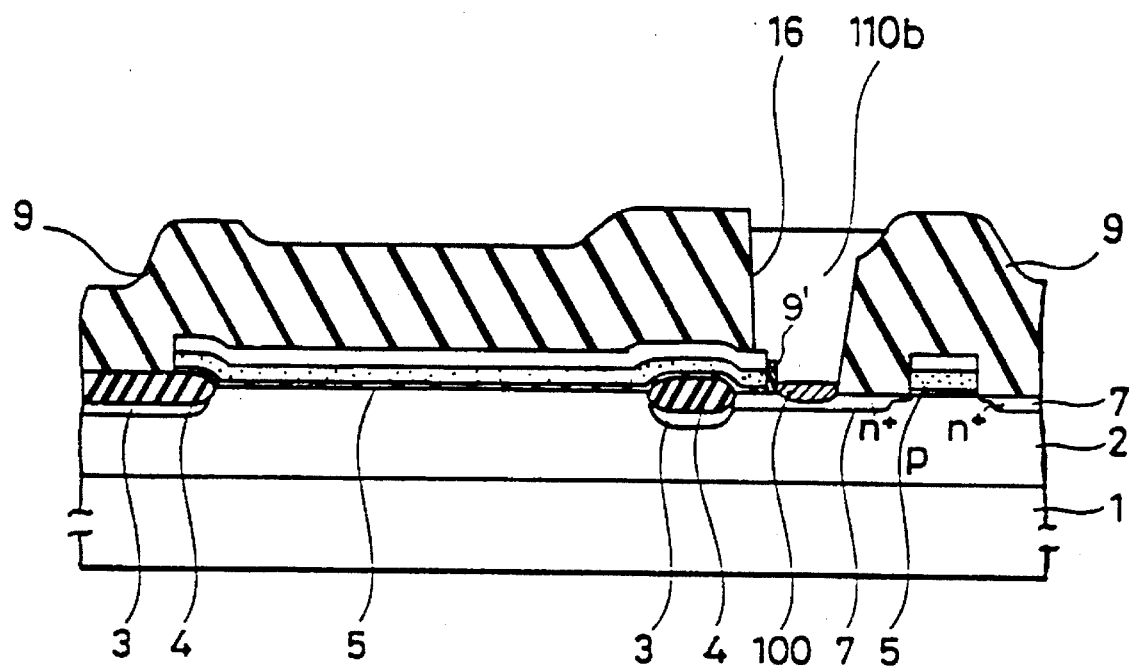

Referring to FIG. 18, non-doped polycrystalline silicon layer 110a is etched using an etch back method to leave polycrystalline silicon layer 110a only in opening 16, so that a non-doped silicon plug layer 110b is formed.

Figure 19:
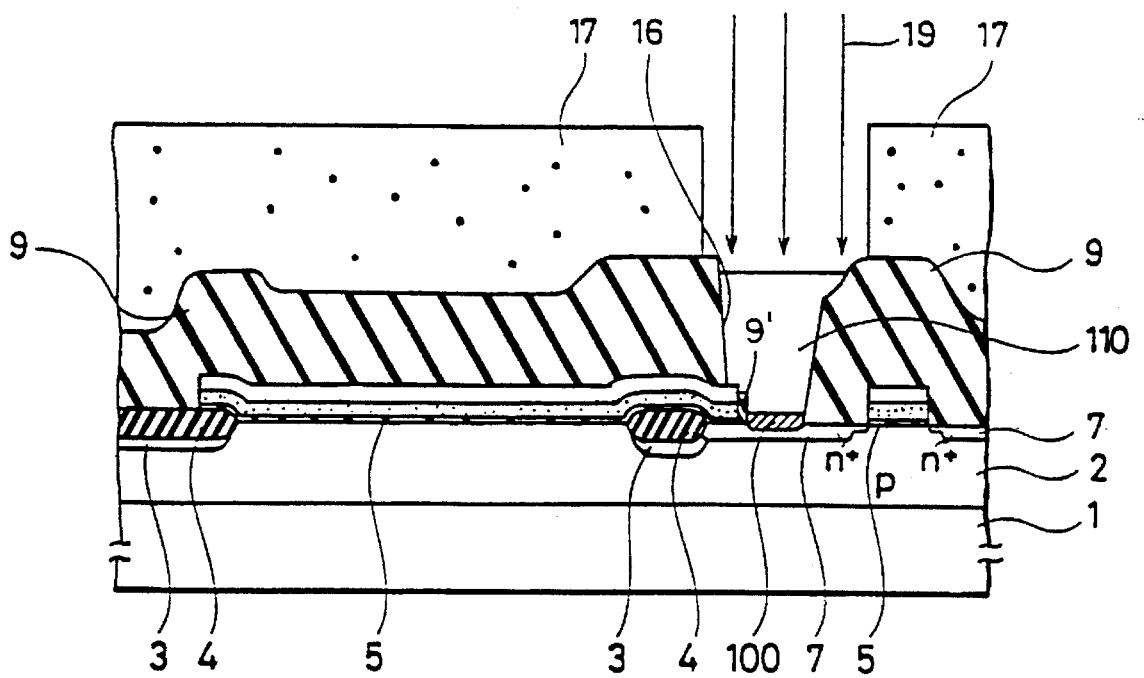

Referring to FIG. 19, a resist pattern 17 having an opening only in the upper portion of opening 16 is formed on the surface of interlevel insulating layer 9. Using the resist pattern 17 as a mask, p type impurity ions 19, for example, boron ions ($B^+$) are implanted into silicon plug player 110b in a dose of, for example, $1.5 \times 10^{16}$ ions/cm$^2$ with implantation energy of 150 keV. Thereafter, p type impurity ions 19 are activated by, for example, an RTA method to form p type silicon plug layer 110. In the RTA method, heat treatment is carried out for thirty seconds at a temperature of 1100° C. in nitrogen ($N_2$) atmosphere within a lamp anneal device using, for example, a halogen lamp as a heat source.

Thereafter, the step of the first embodiment shown in FIG. 8 follows.

Figure 20:
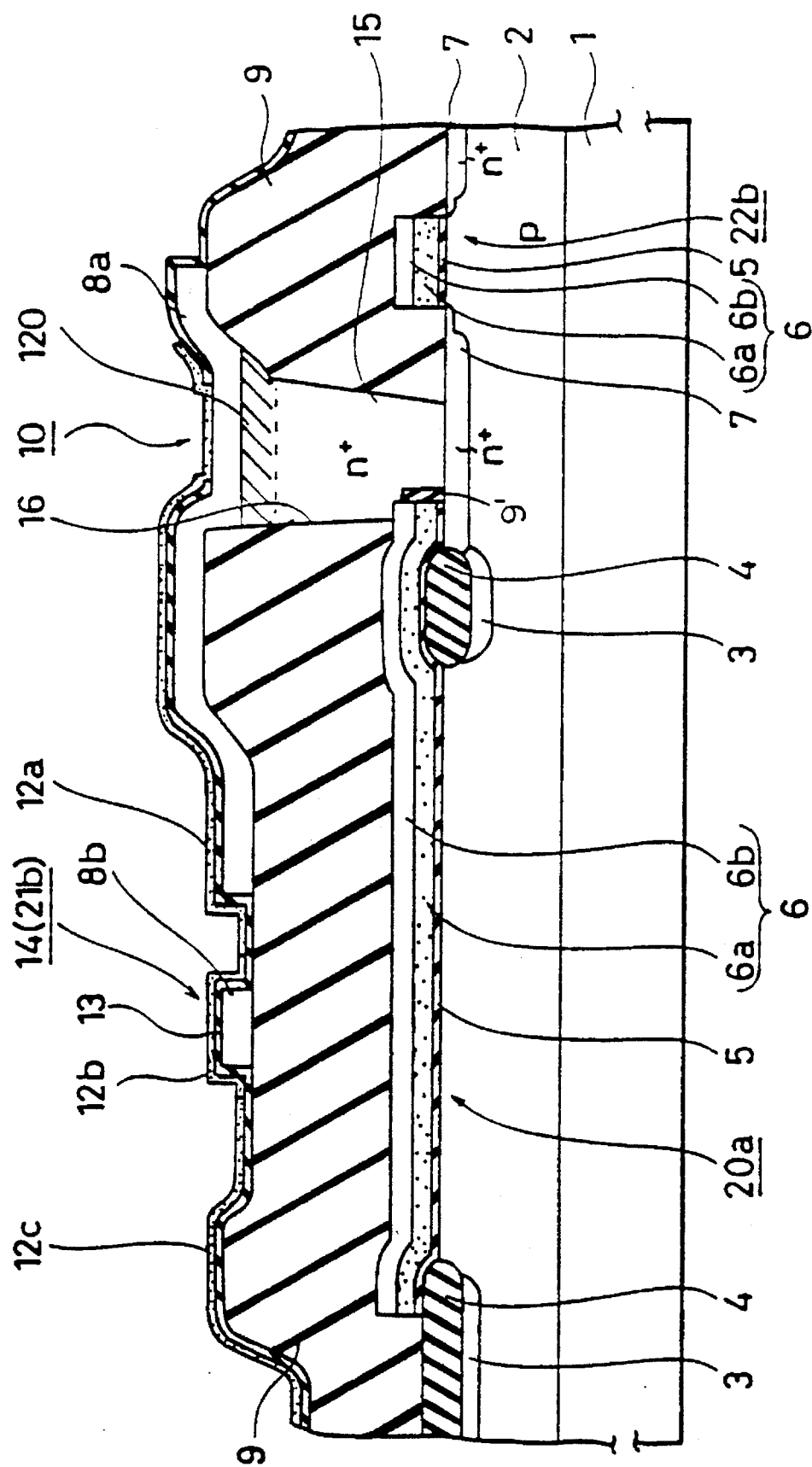
FIG. 20 is a sectional structural view of a memory cell of an SRAM according to a fourth embodiment of the present invention.

A fourth embodiment of the present invention will be described. FIG. 20 is a sectional structural view of a memory cell of an SRAM according to the fourth embodiment. The fourth embodiment is characterized in that an $n^{++}$ impurity layer 120 of a high concentration is formed in a junction portion of silicon plug layer 15 and interconnection layer 8a. A function of $n^{++}$ impurity layer 120 of a high concentration will be described. If a p type impurity layer is joined to an n type impurity layer having a normal concentration, pn junction is caused in the junction portion. When current is supplied to the pn junction, a voltage drop of about 0.8 V in a forward biased state, or a voltage drop of about 10 V in a reverse biased state is caused. Therefore, when silicon plug layer 15 is directly connected to interconnection layer 8a, a voltage drop described above occurs and a sufficient voltage can not be supplied to p channel MOS load transistor 14 through interconnection layer 8a. However, if an n type impurity layer having a very high concentration, as $n^{++}$ impurity layer 120 of a high concentration in this example, is joined to interconnection layer 8a of a p type impurity layer similarly having a high concentration, $p^{++} n^{++}$ junction is formed in a junction portion thereof. If a voltage is applied to the pn junction of a high concentration, for example, $10^{20}$/cm$^3$ or more, a tunnel current based on quantum mechanics flows. The tunnel current prevents a large voltage drop. Therefore, voltage can be sufficiently applied to the p channel MOS load transistor through interconnection layer 8a. $N^{++}$ impurity layer 120 of a high concentration is formed by an ion implantation method, as described below. Therefore, compared to first through third embodiments in which a refractory metal silicide layer is used, it has an advantage that the manufacturing process is simplified.

Figure 21:
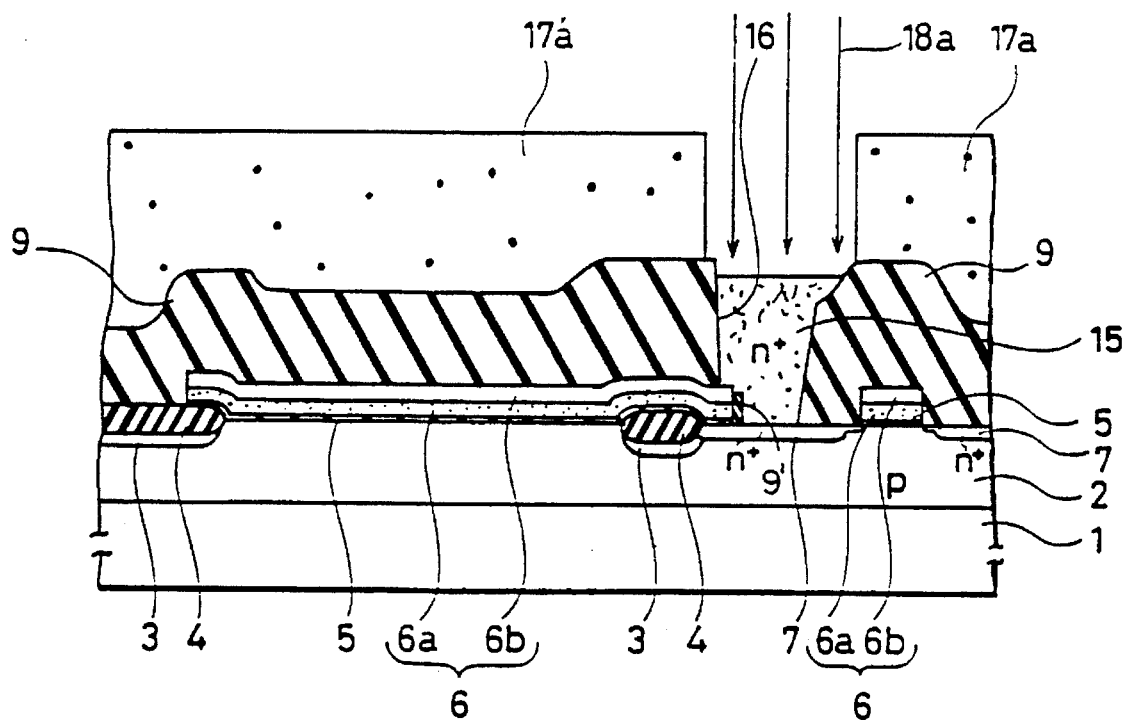
FIGS. 21 through 24 are sectional structural views showing main manufacturing steps of the memory cell shown in FIG. 20.

Manufacturing steps of the memory cell shown in FIG. 20 will be described. FIGS. 21 through 24 are sectional structural views successively showing main manufacturing steps. The step shown in FIG. 21 corresponds to the step of the first embodiment shown in FIG. 5. Referring to FIG. 21, a resist pattern 17a having an opening only in the upper portion of opening 16 is formed on the surface of interlevel insulating layer 9. Using resist pattern 17a as a mask, n type impurity ions 18a are implanted into silicon plug layer 15 to provide n type conductivity. The ion implantation is carried out using, for example, phosphorus (P) ions in a dose of $1.5 \times 10^{16}$ ions/cm$^2$ with implantation energy of 170 keV. In this case, it is important to set implantation energy high in order to implant phosphorus ions so deeply as to reach the central portion of silicon plug layer 15. Moreover, using phosphorus having a large diffusion coefficient in silicon for impurities in the ion implantation is also important. Phosphorus having a large diffusion coefficient diffuses uniformly in the whole silicon plug layer 15.

Figure 22:
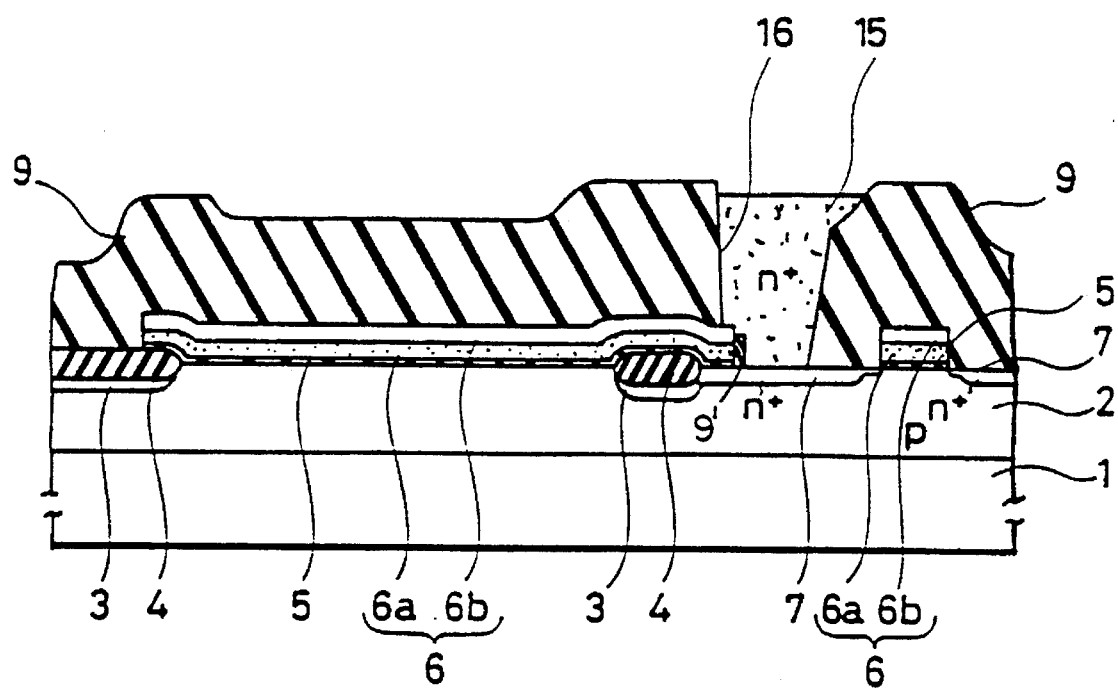

Referring to FIG. 22, after resist pattern 17a is removed, the phosphorus ions introduced into silicon plug layer 15 are activated using, for example, an RTA method to form an $n^+$ silicon plug layer 15. In the RTA method, heat treatment is carried out, for example, for thirty seconds at a temperature of 1100° C. in nitrogen atmosphere using an lamp anneal device having a halogen lamp for a heat source. The reason to remove resist pattern 17a before carrying out the RTA method is that, since the main component of resist pattern 17a is organic substance, harmful substance in the organic substance should be prevented from diffusing in the semiconductor in the heat treatment of the RTA method.

Figure 23:
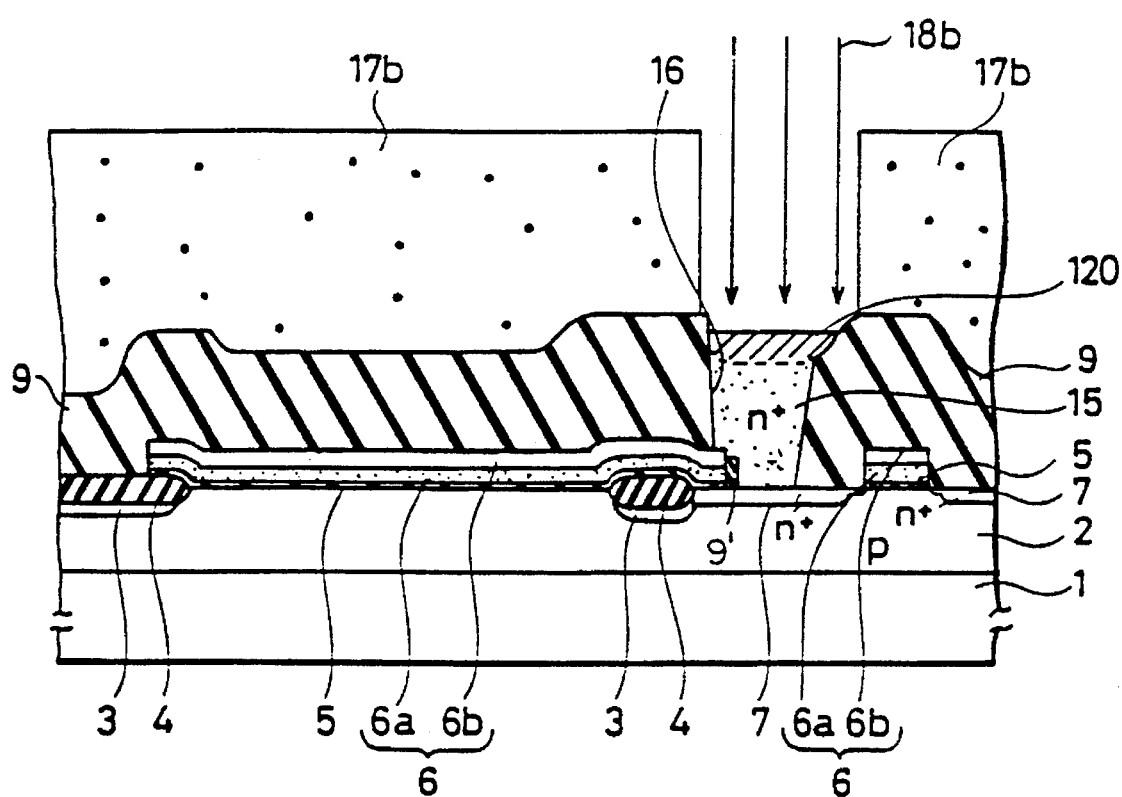

Referring to FIG. 23, a resist pattern 17b having the same pattern as resist pattern 17a formed in FIG. 21 is formed on the surface of interlevel insulating layer 9. N type impurity ions 18b are implanted into the surface of $n^+$ silicon plug layer 15 using, for example, an ion implantation method. The ion implantation is carried out using arsenic in a dose of $3 \times 10^{15}$ ions/cm$^2$ with implantation energy of 10 keV, and $n^{++}$ impurity layer 120 of a high concentration ($1.5 \times 10^{21}$/cm$^3$) is formed. $N^{++}$ impurity layer 120 of a high concentration is formed by implanting arsenic ions. Compared to, for example, phosphorus, arsenic has a smaller diffusion coefficient, so that it can be restrained from diffusing deeply in silicon plug layer 15 by the influence of heat treatment or the like in the subsequent steps. Implantation energy of arsenic ions 18b is set low to form $n^{++}$ impurity layer 120 in a shallow region, that is, at the depth of about 30–50 nm. Heat treatment is not carried out after implantation of arsenic ions 18b in order to suppress the diffusion of $n^{++}$ impurity layer 120 of a high concentration.

Figure 24:
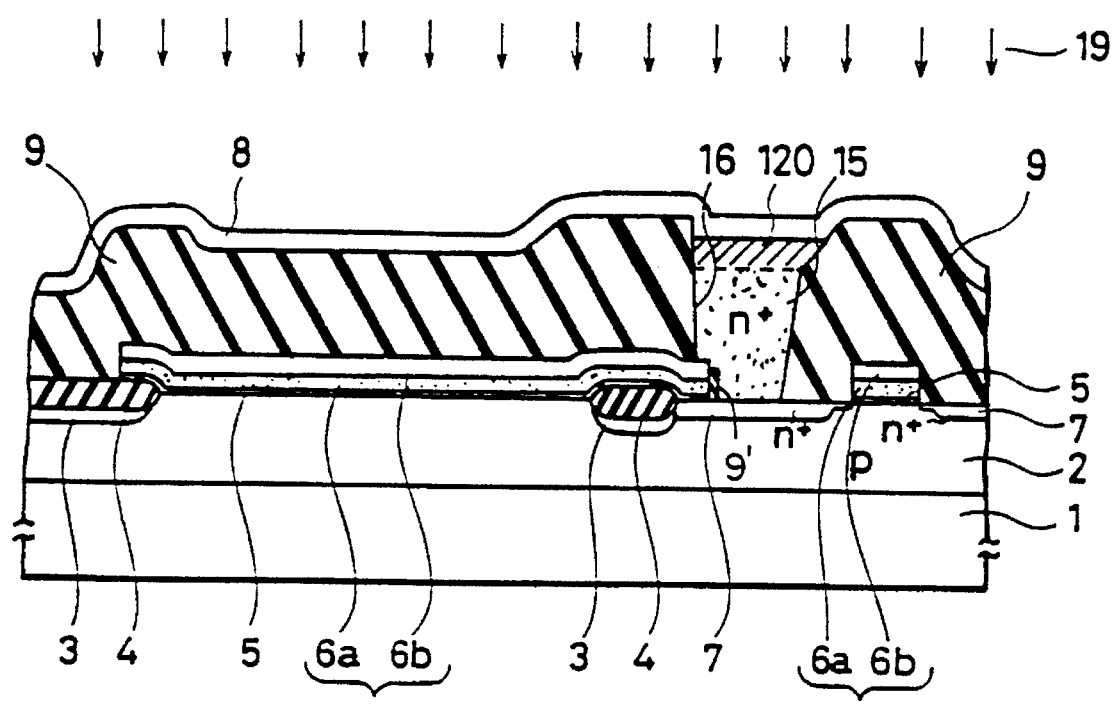

Referring to FIG. 24, a polycrystalline silicon layer 8 to which no impurities are introduced is deposited in a thickness of about 100 nm using an LPCVD method on the surfaces of interlevel insulating layer 9 and $n^{++}$ impurity layer 120 of a high concentration. Then, p type impurity ions 19 are implanted into polycrystalline silicon layer 8 in a dose of about $1 \times 10^{16}$ ions/cm$^2$, and the p type impurity ions are activated in heat treatment. The concentration of the p type impurities introduced into polycrystalline silicon layer 8 is higher ($1 \times 10^{21}$/cm$^3$), compared to the first embodiment. That is because pn junction of a high concentration is formed in a junction portion of $n^{++}$ impurity layer 120 of a high concentration and polycrystalline silicon layer 8.

Thereafter, the step of the first embodiment shown in FIG. 9 follows.

Figure 25:
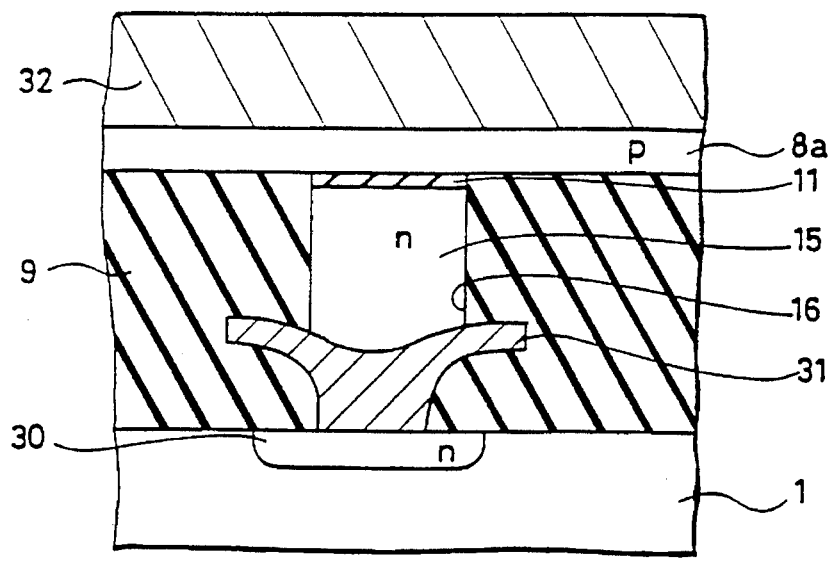
FIG. 25 is a sectional structural view of a memory cell of an SRAM in accordance with a fifth embodiment of the present invention.
Figure 26:
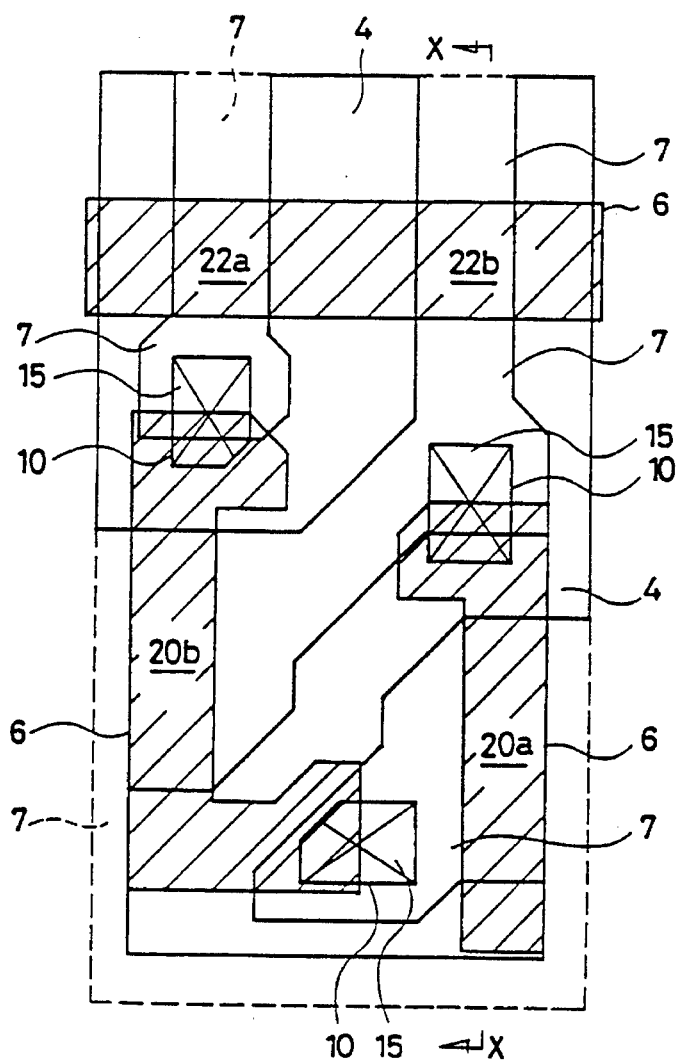
FIG. 26 is a plan structural view showing a plan structure of a lower portion of a memory cell of a conventional SRAM.
Figure 27:
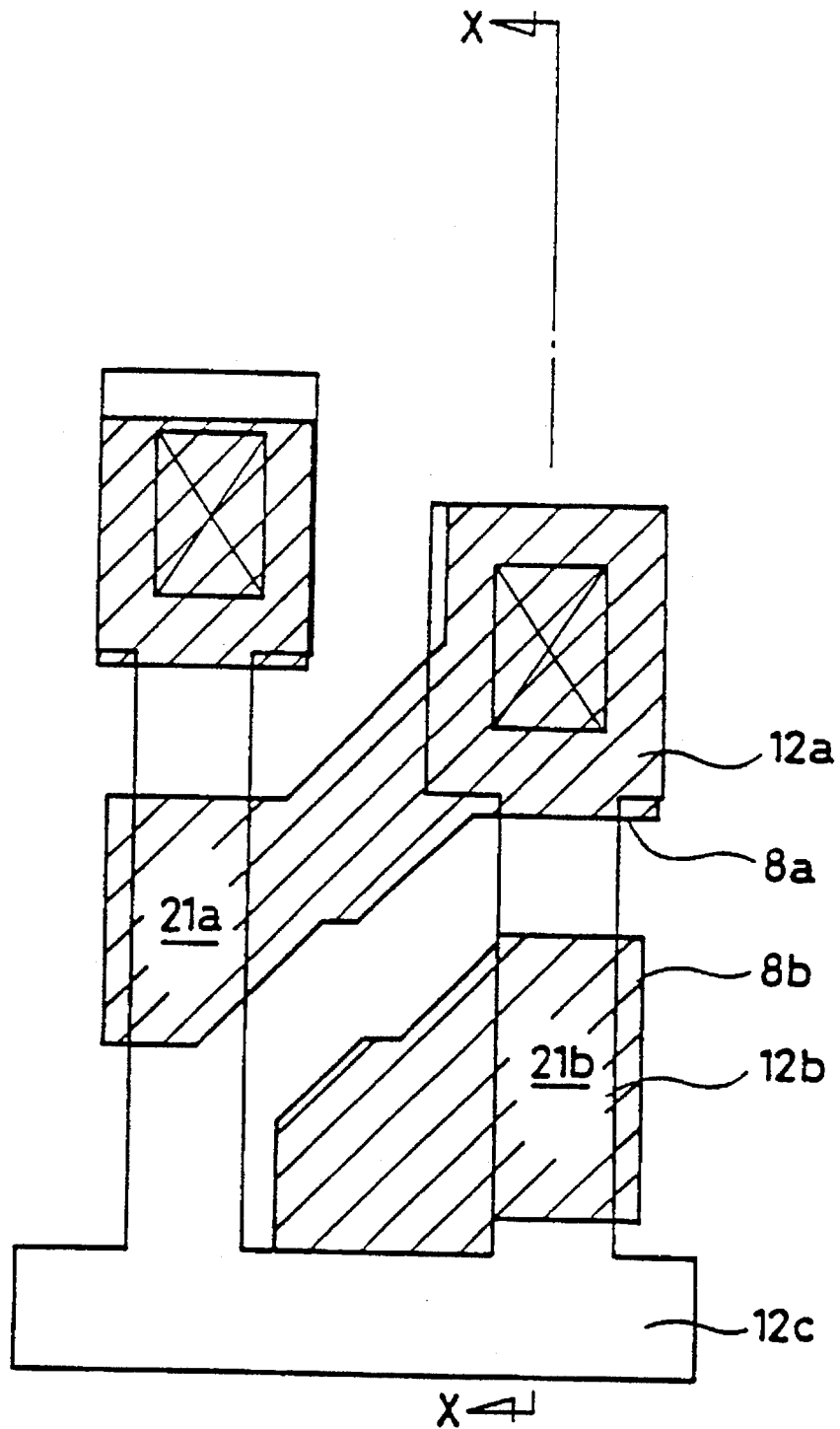
FIG. 27 is a plan structural view showing a plan structure of an upper portion of the memory cell of the conventional SRAM.

A fifth embodiment of the present invention will be described. FIG. 25 is a sectional structural view of direct contact structure in accordance with the fifth embodiment of the present invention. On a surface of a silicon substrate 1, for example, an n type impurity region 30 is formed. A pad layer 31 of a polycrystalline silicon layer is formed on a surface of n type impurity region 30. An opening 16 reaching pad layer 31 is formed in an interlevel insulating layer 9. A silicon plug layer 15 is embedded in opening 16. A refractory metal silicide layer, for example, a titanium silicide 11 is formed on a surface of silicon plug layer 15. Interconnection layer 8a having p type conductivity is formed on a surface of interlevel insulating layer 9. A part of interconnection layer 8a is connected to titanium silicide layer 11. A surface of interconnection layer 8a is covered with a second interlevel insulating layer 32. In the embodiment, conductivity types of silicon plug layer 15 and interconnection layer 8a can be also opposite to those in the above embodiments. Although in the above first through third embodiments and fifth embodiment, the examples in which titanium silicide is used as an intermediate conductive layer were described, other refractory metal silicide such as tungsten silicide, metal such as tungsten, titanium, and molybdenum, alloy of titanium and tungsten, or a nitride film of refractory metal such as a titanium nitride film may be used.

Thus, in the direct contact structure of a semiconductor device in accordance with the present invention, a silicon plug layer is embedded within a contact hole and an upper interconnection layer is formed on a planarized layer, so that patterning precision of the interconnection layer using a photolithography method is improved and reliability of interconnection is enhanced. By interposing an intermediate conductive layer between the layers having different types of conductivity, fine ohmic contact between the layers having different conductivity types can be implemented. Furthermore, since the silicon plug layer can be formed using a known CVD method and an etch back method, complicated manufacturing steps are not needed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having an interconnection contact portion of a first conductivity type, comprising:

a silicon layer;

an interlevel insulating layer on a surface of said silicon layer;

a contact hole formed in said interlevel insulating layer to expose said interconnection contact portion;

a silicon plug of a first type conductivity embedded within said contact hole and having a flat upper surface;

an interconnection layer of polycrystalline silicon having a second conductivity type on a surface of said interlevel insulating layer; and an intermediate conductive layer for reducing magnitude of voltage drop of pn junction between said interconnection layer and said interconnection contact portion wherein said intermediate conductive layer is of a material doped to be more highly conductive than said interconnection layer and said silicon plug.

2. The semiconductor device of claim 1, including an additional conductor layer in said interlevel insulating layer and having a portion exposed through a sidewall of said contact hole.

* * * * *